(12) United States Patent
Trang et al.

(10) Patent No.: US 10,770,415 B2
(45) Date of Patent: Sep. 8, 2020

(54) PACKAGED TRANSISTOR DEVICES WITH INPUT-OUTPUT ISOLATION AND METHODS OF FORMING PACKAGED TRANSISTOR DEVICES WITH INPUT-OUTPUT ISOLATION

(71) Applicant: Cree, Inc., Durham, NC (US)

(72) Inventors: Frank Trang, San Jose, CA (US); Haedong Jang, San Jose, CA (US); Zulhazmi Mokhti, Morgan Hill, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/208,821

(22) Filed: Dec. 4, 2018

(65) Prior Publication Data
US 2020/0176402 A1   Jun. 4, 2020

(51) Int. Cl.
*H01L 23/66* (2006.01)
*H01L 23/00* (2006.01)
(Continued)

(52) U.S. Cl.
CPC ............ *H01L 23/66* (2013.01); *H01L 21/565* (2013.01); *H01L 23/315* (2013.01); *H01L 23/552* (2013.01); *H01L 24/48* (2013.01); *H01L 24/49* (2013.01); *H01L 24/85* (2013.01); *H03H 7/38* (2013.01); *H01L 2223/6611* (2013.01);
(Continued)

(58) Field of Classification Search
CPC ............ H01L 23/66; H01L 2223/6611; H01L 23/552; H01L 24/48; H01L 24/49; H01L 2924/19107; H01L 2924/48195; H01L 2924/1304; H01L 2924/1421; H01L 2924/19042; H01L 2224/49176; H01L 2924/30111; H01L 2924/19041; H01L 2924/19105; H01L 24/85; H01L 2223/6655; H01L 21/565; H01L 2924/3025
See application file for complete search history.

(56) References Cited

U.S. PATENT DOCUMENTS

| 4,498,093 A | 2/1985 | Allyn |
| 4,721,986 A | 1/1988 | Kinzer |

(Continued)

FOREIGN PATENT DOCUMENTS

JP   2013247618   12/2013

OTHER PUBLICATIONS

Trang et al., U.S. Appl. No. 16/039,703, filed Jul. 19, 2018 (35 pages).
(Continued)

*Primary Examiner* — Jasmine J Clark
(74) *Attorney, Agent, or Firm* — Myers Bigel, P.A.

(57) ABSTRACT

Packaged transistor devices are provided that include a transistor on a base of the packaged transistor device, the transistor comprising a control terminal and an output terminal, a first bond wire electrically coupled between an input lead and the control terminal of the transistor, a second bond wire electrically coupled between an output lead and the output terminal of the transistor, and an isolation material that is and physically between the first bond wire and the second bond wire, wherein the isolation material is configured to reduce a coupling between the first bond wire and the second bond wire.

20 Claims, 19 Drawing Sheets

(51) Int. Cl.
 *H01L 23/552* (2006.01)
 *H01L 23/31* (2006.01)
 *H01L 21/56* (2006.01)
 *H03H 7/38* (2006.01)

(52) U.S. Cl.
 CPC ............... *H01L 2224/48096* (2013.01); *H01L 2224/48195* (2013.01); *H01L 2224/49176* (2013.01); *H01L 2924/19041* (2013.01); *H01L 2924/19042* (2013.01); *H01L 2924/19105* (2013.01); *H01L 2924/19107* (2013.01); *H01L 2924/3025* (2013.01); *H01L 2924/30111* (2013.01)

(56) References Cited

U.S. PATENT DOCUMENTS

| | | |
|---|---|---|
| 5,025,296 A | 6/1991 | Fullerton |
| 5,430,247 A | 7/1995 | Bockelman |
| 5,500,522 A | 3/1996 | Eshraghian |
| 5,592,006 A | 1/1997 | Merrill |
| 6,023,086 A | 2/2000 | Reyes |
| 6,274,896 B1 | 8/2001 | Gibson |
| 6,316,793 B1 | 11/2001 | Sheppard |
| 6,507,047 B2 | 1/2003 | Litwin |
| 6,765,268 B2 | 7/2004 | Akamine |
| 6,900,482 B2 | 5/2005 | Aoki |
| 7,135,747 B2 | 11/2006 | Allen |
| 7,851,832 B2 | 12/2010 | Takagi |
| 7,908,799 B2 | 3/2011 | Sheppard |
| 8,076,994 B2 | 12/2011 | Farrell |
| 8,178,908 B2 | 5/2012 | Greenberg |
| 8,536,622 B2 | 9/2013 | Takemae |
| 8,860,093 B2 | 10/2014 | Sasaki |
| 8,866,197 B2 | 10/2014 | Becker |
| 8,872,279 B2 | 10/2014 | Greenberg et al. |
| 9,190,479 B1 | 11/2015 | Greenberg |
| 9,607,953 B1 * | 3/2017 | Li .......................... H01L 23/66 |
| 9,653,410 B1 | 5/2017 | Holmes et al. |
| 9,741,673 B2 | 8/2017 | Andre |
| 9,786,660 B1 | 10/2017 | Farrell |
| 9,979,361 B1 * | 5/2018 | Mangaonkar ........... H03F 1/565 |
| 10,270,402 B1 * | 4/2019 | Holmes ................... H03F 1/565 |
| 10,483,352 B1 | 11/2019 | Mokhti et al. |
| 2001/0012671 A1 | 8/2001 | Hoshino |
| 2002/0033508 A1 | 3/2002 | Morikawa |
| 2002/0039038 A1 | 4/2002 | Miyazawa |
| 2002/0066908 A1 | 6/2002 | Smith |
| 2002/0167023 A1 | 11/2002 | Chavarkar |
| 2003/0102482 A1 | 6/2003 | Saxler |
| 2004/0061129 A1 | 4/2004 | Saxler |
| 2006/0081985 A1 | 4/2006 | Beach |
| 2008/0100404 A1 | 5/2008 | Vice |
| 2008/0157222 A1 | 7/2008 | Wang |
| 2009/0020848 A1 | 1/2009 | Ono |
| 2009/0108357 A1 | 4/2009 | Takagi |
| 2009/0212846 A1 | 8/2009 | Cutter |
| 2009/0278207 A1 | 11/2009 | Greenberg |
| 2011/0018631 A1 | 1/2011 | Ng |
| 2011/0102077 A1 | 5/2011 | Lamey |
| 2012/0012908 A1 | 1/2012 | Matsunaga |
| 2012/0199847 A1 | 8/2012 | Takagi |
| 2012/0267795 A1 | 10/2012 | Shimura |
| 2013/0099286 A1 | 4/2013 | Imada |
| 2013/0228787 A1 | 9/2013 | Yamamura |
| 2013/0313653 A1 | 11/2013 | Brech |
| 2014/0014969 A1 | 1/2014 | Kunii |
| 2015/0129965 A1 | 5/2015 | Roy |
| 2015/0145025 A1 | 5/2015 | Yoshida et al. |
| 2015/0311131 A1 | 10/2015 | Watts et al. |
| 2015/0349727 A1 | 12/2015 | Flowers et al. |
| 2016/0380606 A1 | 12/2016 | Limjoco et al. |
| 2020/0075479 A1 | 3/2020 | Khalil et al. |

OTHER PUBLICATIONS

PCT International Search Report and the Written Opinion of the International Searching Authority, or the Declaration, dated Dec. 13, 2019, for corresponding PCT International Application No. PCT/US2019/040960.

International Search Report and Written Opinion for PCT/US2019/063961 dated Mar. 16, 2020, 14 pages.

* cited by examiner

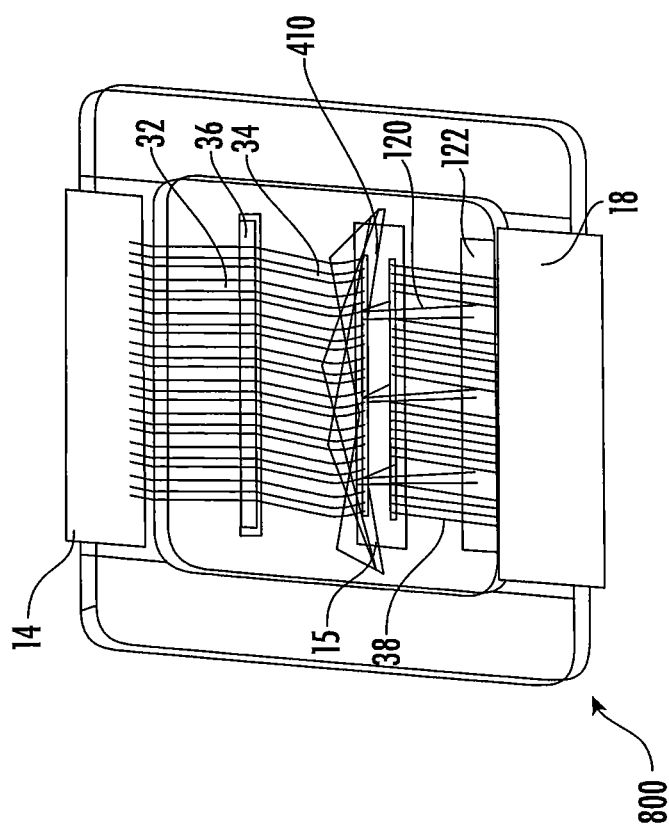
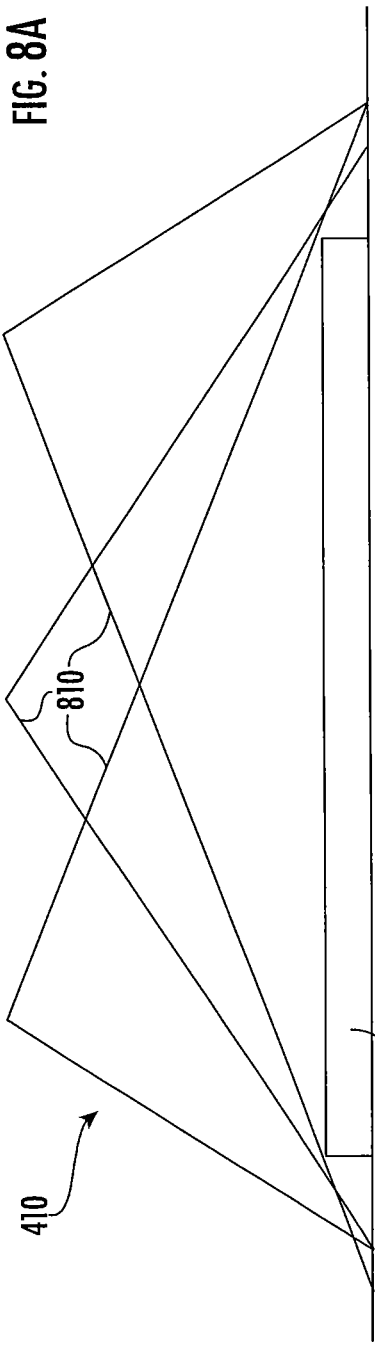
FIG. 8A
FIG. 8B

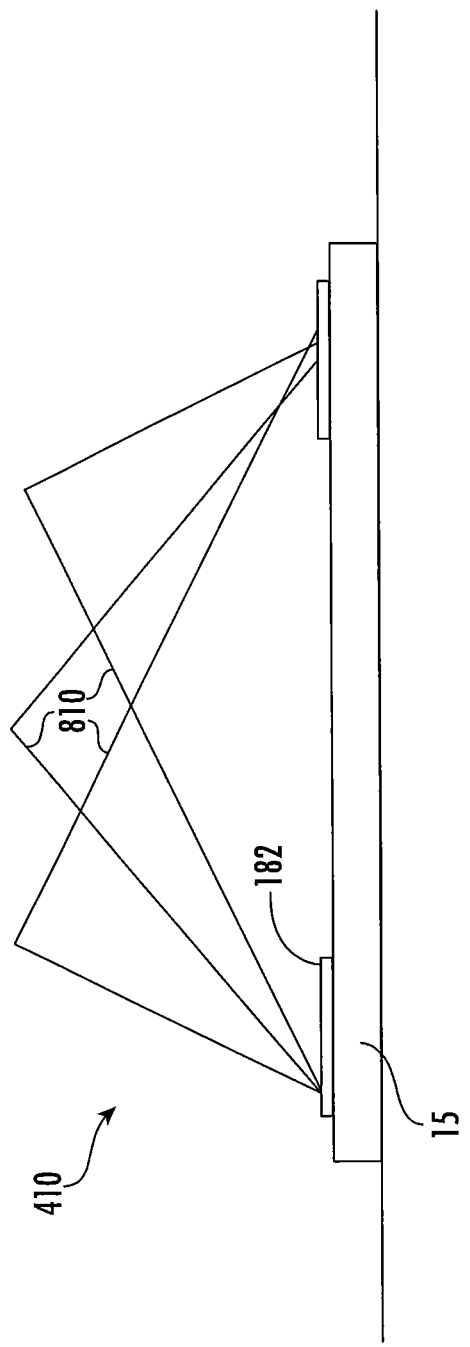

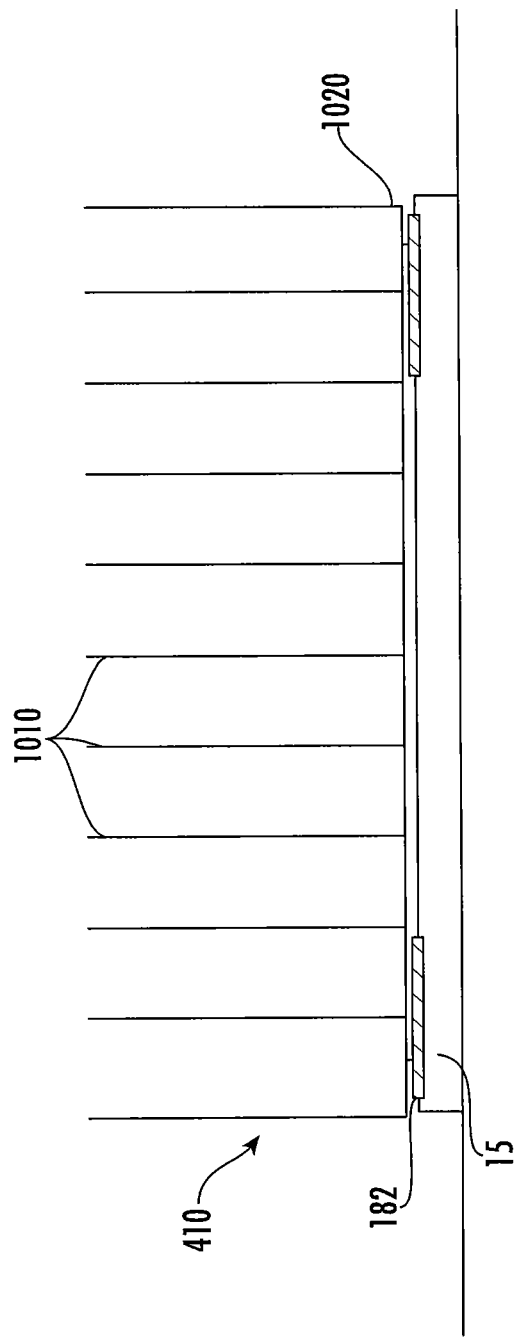

PACKAGED TRANSISTOR DEVICES WITH INPUT-OUTPUT ISOLATION AND METHODS OF FORMING PACKAGED TRANSISTOR DEVICES WITH INPUT-OUTPUT ISOLATION

FIELD

This invention relates generally to Radio Frequency (RF) transistors and, more particularly, the invention relates to packaged RF transistors having isolation between input and output signals of the packaged RF transistor.

BACKGROUND

Packaged RF power devices typically include a transistor die mounted on a base and enclosed in a package. An RF input signal is supplied to the transistor through an RF input lead that extends from outside the package to the inside of the package, and an RF output signal is delivered from the device through an RF output lead that extends from inside the package to the outside. An input matching circuit can be included within the package, and can be connected between the RF input lead and an input terminal of the RF transistor. The input matching circuit provides an impedance match at the input of the transistor at the fundamental operating frequency of the transistor. An output matching circuit can also be included within the package, and can be connected between an output terminal of the RF transistor and the RF output lead. The output matching circuit may provide an impedance match at the output of the transistor at the fundamental operating frequency of the transistor.

The RF transistor can include a large periphery transistor die that includes a number of discrete transistor cells on a common substrate that are electrically connected in parallel. Input matching can be particularly beneficial for such devices, as it can increase the usable bandwidth of the devices. Furthermore, the impedance values of elements of the input and/or output matching network must be carefully selected to avoid creating odd mode oscillations. Selection of the impedance values, including selection of appropriate inductances through bond wire lengths, can limit the topology of the matching network.

Packaged RF power devices have air-cavity and overmold configurations. In an air-cavity configuration, elements of the packaged RF power device such as the transistor die and/or components of a matching network may be disposed in an air cavity within the packaged RF power device. In an overmolded plastic (OMP) configuration, elements of the packaged RF power device may be encased in a polymer material that surrounds and is in contact with the devices and bond wires of the packaged RF power device.

SUMMARY

Various embodiments described herein provide transistor device having increased isolation between input and output bond wires.

Pursuant to embodiments of the present invention, packaged transistor devices are provided that include a transistor on a base of the packaged transistor device, the transistor comprising a control terminal and an output terminal, a first bond wire electrically coupled between an input lead and the control terminal of the transistor, a second bond wire electrically coupled between an output lead and the output terminal of the transistor, and an isolation material that is and physically between the first bond wire and the second bond wire, wherein the isolation material is configured to reduce a coupling between the first bond wire and the second bond wire.

In some embodiments, the transistor comprises a plurality of unit cell transistors that are electrically connected in parallel.

In some embodiments, the isolation material is a conductive isolation material, a magnetic isolation material, or a lossy dielectric isolation material. The lossy dielectric isolation material may include a loss tangent greater than 0.1.

In some embodiments, the packaged transistor device may further include a package that houses the transistor, with the input lead and the output lead extending from the package.

In some embodiments, a portion of the isolation material contacts the package.

In some embodiments, the package comprises an air cavity, and at least a portion of the first bond wire and at least a portion of the second bond wire extend into the air cavity.

In some embodiments, the package includes a plastic overmold.

In some embodiments, the isolation material is disposed above the transistor.

In some embodiments, the control terminal is on a first side of the transistor and the output terminal is on a second side of the transistor, opposite the first side, the plurality of third bond wires extend from a third side of the transistor to a fourth side of the transistor, and the third side and fourth side of the transistor are different than the first side and the second side.

In some embodiments, a first portion of a first one of the third bond wires extends above the transistor at a first height, and a second portion of a second one of the third bond wires extends above the transistor at a second height that is greater than the first height.

In some embodiments, the isolation material includes a plurality of metal segments.

In some embodiments, the plurality of metal segments extend in a direction substantially perpendicular to a top surface of the transistor.

In some embodiments, the isolation material comprises a metal wall.

In some embodiments, the metal wall extends in a direction substantially perpendicular to a top surface of the transistor.

In some embodiments, the isolation material is configured to be connected to a ground signal.

In some embodiments, the isolation material is configured to be electrically floated.

In some embodiments, the isolation material comprises a metal mesh.

In some embodiments, the packaged transistor device further includes an input matching circuit that is electrically coupled between the input lead and the control terminal, and the first bond wire is an inductive element within the input matching circuit.

Pursuant to further embodiments of the present invention, a packaged transistor device is provided that includes a transistor on a base of the packaged transistor device, the transistor comprising a control terminal and an output terminal on opposite sides of the transistor, a first inductor connected to the control terminal, the first inductor comprising a first portion that extends at a first level that is farther from the base than a top surface of the transistor, a second inductor connected to the output terminal, the second inductor comprising a second portion that extends at a second level that is farther from the base than the top surface of the transistor, and an isolation material that is between the first portion and the second portion, where the isolation material is configured to reduce a coupling between the first inductor and the second inductor.

In some embodiments, the isolation material is electrically connected to a reference signal.

In some embodiments, the first inductor is a component of an impedance matching circuit or a harmonic reduction circuit.

In some embodiments, the packaged transistor device further includes a package that houses the transistor, with an input lead and an output lead extending from the package, and the input lead is connected to the control terminal and the output lead is connected to the output terminal.

In some embodiments, a portion of the isolation material contacts the package.

In some embodiments, the package comprises an air cavity, and at least a portion of the first inductor and at least a portion of the second inductor extend into the air cavity.

In some embodiments, the package comprises a plastic overmold.

In some embodiments, the isolation material is a conductive isolation material, a magnetic isolation material, or a lossy dielectric isolation material. In some embodiments, the lossy dielectric isolation material comprises a loss tangent greater than 0.1.

In some embodiments, the isolation material comprises a plurality of bond wires.

In some embodiments, a first portion of a first one of the bond wires extends above the transistor at a first height, and a second portion of a second one of the bond wires extends above the transistor at a second height, greater than the first height.

In some embodiments, the isolation material is disposed above the transistor.

In some embodiments, the isolation material comprises a plurality of metal segments.

In some embodiments, the plurality of metal segments extend in a direction substantially perpendicular to a top surface of the transistor.

In some embodiments, the isolation material comprises a metal wall.

Pursuant to further embodiments of the present invention, a method of manufacturing a packaged transistor device includes providing a transistor comprising a control terminal and an output terminal on opposite sides of the transistor, connecting a first bond wire to the control terminal, connecting a second bond wire to the output terminal, placing an isolation material on the transistor between the first bond wire and the second bond wire, wherein the isolation material is configured to reduce a coupling between the first bond wire and the second bond wire, and providing a package to enclose the transistor, the first bond wire, the second bond wire, and the isolation material.

In some embodiments, providing the transistor comprises providing the transistor within an air cavity of the packaged transistor device.

In some embodiments, the isolation material extends into a sidewall of the air cavity.

In some embodiments, wherein placing the isolation material on the transistor comprises providing a plurality of third bond wires between the first bond wire and the second bond wire.

In some embodiments, providing the package comprises placing a plastic overmold on the transistor, and placing the isolation material on the transistor comprises recessing the plastic overmold In some embodiments, recessing the plastic overmold includes providing a plurality of recesses into the plastic overmold, and providing a metal material into the plurality of recesses.

In some embodiments, recessing the plastic overmold includes providing a trench that extends on the transistor into the plastic overmold, and providing a metal material into the trench.

In some embodiments, the isolation material is configured to be connected to a ground signal.

In some embodiments, the isolation material is disposed above the transistor.

In some embodiments, the isolation material is a conductive isolation material, a magnetic isolation material, or a lossy dielectric isolation material.

In some embodiments, the lossy dielectric isolation material comprises a loss tangent greater than 0.1.

BRIEF DESCRIPTION OF THE DRAWINGS

The accompanying drawings, which are included to provide a further understanding of the invention and are incorporated in and constitute a part of this application, illustrate certain embodiment(s) of the invention.

FIG. 8A is a perspective view of a packaged transistor device incorporating bond wires as an isolation material according to embodiments of the invention. FIG. 8B is a cross-sectional view illustrating the configuration of the isolation material of the packaged transistor device of FIG. 8A. FIG. 8C is a cross-sectional view illustrating an additional configuration of the isolation material of the packaged transistor device of FIG. 8A.

FIGS. 10A and 10B a schematic cross-sectional view illustrating an isolation material according to further embodiments of the invention.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Pursuant to embodiments of the present invention, packaged transistor devices are provided that include an isolation material placed between input and output bond wires to reduce coupling therebetween. This input and output bond wires may be used to couple the transistor of the packaged transistor device to respective input and output leads of the packaged transistor device, and may also be used to provide impedance matching and/or harmonic reduction for the packaged transistor device.

Some embodiments of the invention provide packaged RF power transistors. RF power transistors typically include a plurality of transistor cells operating in parallel. Transistors that can be included in packages according to embodiments of the invention can include metal-oxide-semiconductor field-effect transistors (MOSFETs), including laterally diffused MOSFETs (LDMOSFETs) or other semiconductor devices, such as bipolar devices, metal-semiconductor FET (MESFET) devices, heterojunction bipolar transistor (HBT) devices, and high-electron-mobility transistor (HEMT) devices. The transistors can be made using narrow or wide bandgap semiconductors. For example, the transistors can include silicon LDMOS and/or bipolar transistors, and/or III-V devices such as GaAs MESFETs, InGaP HBTs, GaN HEMT devices, GaN bipolar transistors, etc.

Figure 1A:
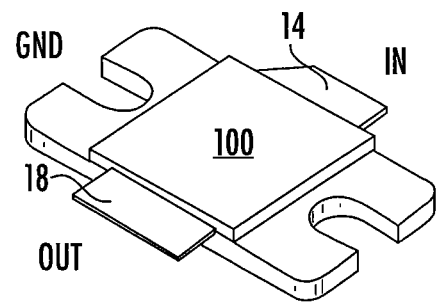
FIG. 1A is a perspective view of an example packaged RF power transistor device.
Figure 1B:
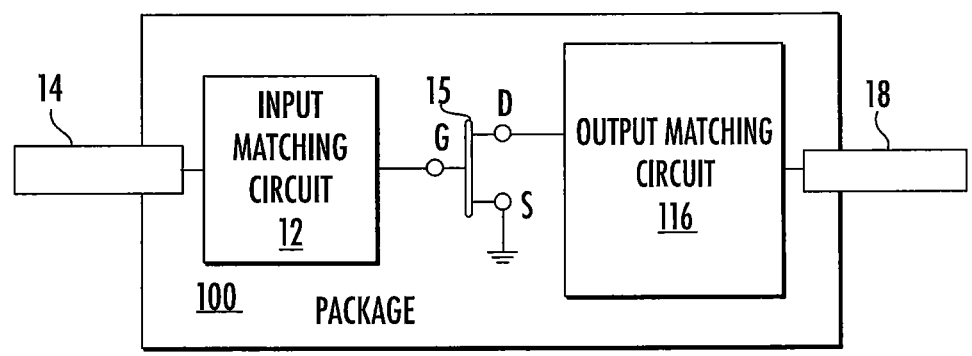
FIG. 1B is a functional block diagram of an example layout of the packaged RF power transistor device of FIG. 1A.

RF power transistors providing ten watts or more of power can be packaged as discrete devices. FIG. 1A is a perspective view of an example packaged transistor device 100. FIG. 1B is a functional block diagram of an example layout of the packaged transistor device 100 of FIG. 1A.

Referring to FIGS. 1A and 1B, the packaged transistor device 100 may include a transistor 15 (which may be a FET or bipolar device, for example). The packaged transistor device 100 may include an input matching circuit 12 connecting an input lead 14 to a control electrode of the transistor 15 (e.g., a gate G of a FET or a base of a bipolar transistor). The transistor 15 may be a large periphery RF transistor including a plurality of transistor cells connected in parallel. An output lead 18 may be connected to an output electrode of the transistor 15 (e.g., the drain D of a FET or the collector or emitter of a bipolar transistor). The RF input lead 14 and the output lead 18 may extend outside the packaged transistor device 100, as shown in FIG. 1A. In some embodiments, the source S of the transistor 15 may be grounded.

As illustrated in FIG. 1B, an input matching circuit 12 may be provided within the packaged transistor device 100. According to some embodiments of the invention, the input matching circuit 12 of the packaged transistor device 100 may include one or more capacitors and/or other inductive elements to provide impedance matching to the input lead 14 of the packaged transistor device 100. In some embodiments, the input matching circuit 12 may include circuit elements for harmonic reduction. Wirebond connections may be provided from the one or more capacitors to respective cells (or groups of cells) of a transistor 15 (e.g., a multi-cell RF transistor die).

An output matching circuit 116 can also be provided inside the device package. The output matching circuit 116 may include impedance matching elements and/or a harmonic reducer so that harmonic reduction can occur before the signal reaches the output lead 18. For example, the impedance matching elements may provide capacitive and/or inductive elements to match an impedance as seen at the output lead 18. In some embodiments, the output matching circuit 116 may include a shunt capacitor acting as a DC blocking element. The harmonic reducer may improve linearity of a packaged power transistor by reducing second and/or higher order harmonics within the device package itself. Placing the output matching circuit 116 inside the package (versus outside the package) may improve the performance of the output matching circuit 116 across a broad range of frequencies and/or output power levels.

Methods of forming internal harmonic reducers and input/output matching networks are discussed, for example in U.S. Pat. No. 8,076,994 entitled "RF power transistor packages with internal harmonic frequency reduction and methods of forming RF power transistor packages with internal harmonic frequency reduction," to Farrell, et al., and/or U.S. Pat. No. 9,741,673 entitled "RF transistor packages with high frequency stabilization features and methods of forming RF transistor packages with high frequency stabilization features," to Andre, et al, both of which are incorporated by reference herein in their entireties.

For example, as shown in FIG. 1B, an output matching circuit 116 including a harmonic reducer can be included within a package of the packaged transistor device 100 including an RF power transistor 15 at the output (drain) of the transistor 15. The harmonic reducer of the output matching circuit 116 may be configured to reduce the energy at a harmonic frequency, such as the second harmonic frequency, in the output signal.

Though FIG. 1B illustrates an input matching circuit 12 including impedance matching elements at an input of the transistor 15 and an output matching circuit 116 including a harmonic reducer at an output of the transistor 15, it will be understood that other configurations are possible. For example, the output matching circuit 116 may include additional impedance matching elements in addition to, or instead of, the impedance matching elements of the input matching circuit 12. Similarly, the input matching circuit 112 may also include a harmonic reducer coupled to the input lead 14 rather than the RF output lead 18, or the packaged transistor device 100 may include a harmonic reducer in both the input matching circuit 12 and the output matching circuit 116. For purposes of convenience, the configuration of FIG. 1B will be discussed as an example, but the present invention may be equally applied to other configurations of impedance matching circuits and harmonic reducers at either the input or output of the transistor 15. As used herein, an input matching circuit refers to any circuit that is between (e.g., electrically coupled between) the input lead and the transistor of a packaged transistor device that is used to provide impedance matching and/or harmonic reduction at the input of the packaged transistor device. As used herein, an output matching circuit refers to any circuit that is between (e.g., electrically coupled between) the transistor and the output lead of the packaged transistor device that is used to provide impedance matching and/or harmonic reduction at the output of the packaged transistor device.

Figure 2A:
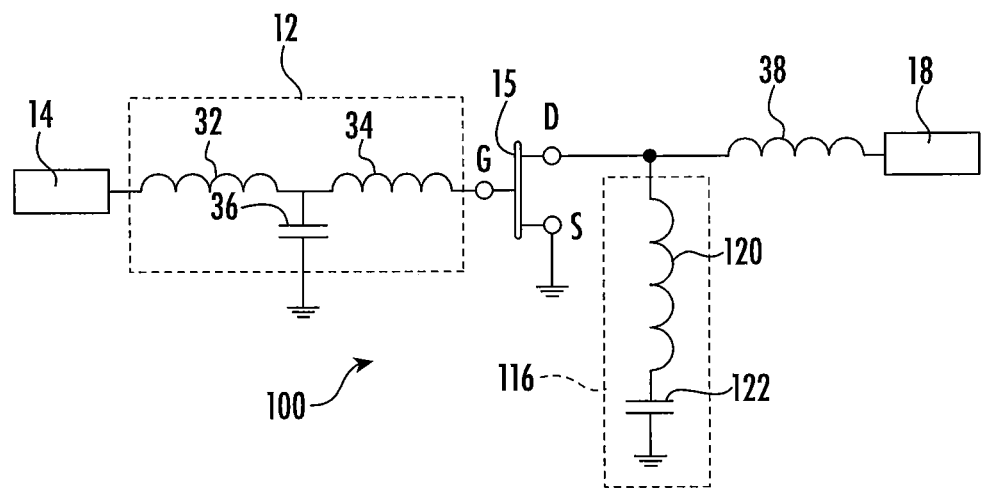
FIG. 2A is a schematic circuit diagram for a packaged transistor device including an RF power transistor, an input matching circuit, and an output matching circuit.
Figure 2B:
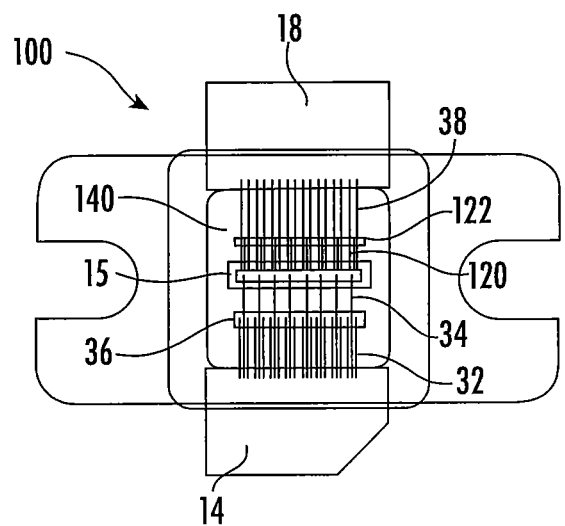
FIG. 2B is an example physical layout of the packaged transistor device that is illustrated in FIG. 2A.

FIG. 2A is a schematic circuit diagram for a packaged transistor device 100 including a transistor 15, an input matching circuit 12, and an output matching circuit 116, such as the packaged transistor device 100 of FIG. 1B. FIG. 2B is an example physical layout of the packaged transistor device 100 that is illustrated in FIG. 2A.

Referring to FIGS. 2A and 2B, an input matching circuit 12 may be connected between an input lead 14 and a gate G of the transistor 15. The input matching circuit 12 may include an inductive wire bond connection including a bond wire 32 extending between the input lead 14 and a first terminal of a capacitor 36, and an inductive wire bond connection including a bond wire 34 extending from the first terminal of the capacitor 36 to the gate G of the transistor 15. The capacitor 36 may be formed on the base 140 of the packaged transistor device 100 between the transistor 15 and the input lead 14. The inductance of the bond wire 32 and bond wire 34, and the capacitance of the capacitor 36 may be selected so as to match an external impedance that is connected to the input lead 14 with an internal impedance of the packaged transistor device 100.

The source S of the transistor 15 may be grounded, and an output lead 18 may be connected to the drain D of the transistor 15 via an inductive wire bond connection including a bond wire 38 extending from the drain D of the transistor to the output lead 18.

The packaged transistor device 100 may also include an output matching circuit 116 that is connected between the drain D of the transistor 15 and ground. In the embodiment illustrated in FIG. 2A, the output matching circuit 116 include a harmonic reducer with an inductive element (e.g., an inductive bond wire) 120 in series with a capacitor 122. The capacitor 122 may be mounted on the base 140 of the packaged transistor device 100 adjacent the transistor 15, and the inductive bond wire 120 may include a bond wire 120 extending from the drain D of the transistor 15 to the capacitor 122. In particular, the capacitor 122 may be formed on the base 140 of the packaged transistor device 100 between the transistor 15 and the output lead 18. In some embodiments, the inductive bond wire 38 may pass over the capacitor 122.

It will be appreciated that the base 140 of the packaged transistor device 100 can refer to any structural member on which the transistor 15 is mounted, and accordingly can correspond to a substrate, flange, die carrier, or the like.

The inductance of the bond wire 120 and the capacitance of the capacitor 122 may be selected so as to provide a short circuit and/or low impedance path to ground for signals at the harmonic frequency relative to the fundamental operating frequency of the transistor 15. For example, for a fundamental operating frequency of 2.5 GHz, the values of capacitance and inductance may be selected to provide a short circuit at a frequency of 5 GHz. The selection of such values is known in the art. The actual values used may depend on the configuration and/or physical layout of the circuit. As an example and not by way of limitation, for a transistor 15 designed to operate at a fundamental operating frequency f, the capacitance C of the capacitor 122 and inductance L of the inductive bond wire 120, respectively, may be chosen to satisfy the equation:

$$2\pi f = \frac{1}{\sqrt{LC}}$$

As an example and not by way of limitation, assuming a fundamental operating frequency of 2.5 GHz, to provide a short circuit/low impedance path at the second harmonic frequency (i.e., at 5 GHz), the capacitor 122 may have a capacitance C of about 0.4 pF, and the inductor may have an inductance L of about 2.5 nH. The presence of the capacitor 122 may degrade the performance of packaged transistor device 100 in terms of power and/or efficiency, but such reduction in performance may be offset by the improvement in linearity over a wide frequency range that can be obtained according to some embodiments.

The invention described herein results, in part, from a recognition that the configuration of the bond wires used in the impedance matching and/or harmonic reduction circuit of a packaged transistor device, such as the packaged transistor device 100 of FIGS. 1A, 1B, 2A, and 2C, may result in a coupling between the bond wires that adversely impacts the performance of the packaged transistor device 100. For example, gate and drain bond wires, such as bond wires 34, 38, and 120 of FIGS. 2A and 2B, may introduce a parasitic capacitance between the gate and drain of the transistor 15 (e.g., Cgd) which may cause an adverse effect on the stability and efficiency of the packaged transistor device 100. In addition, these bond wires may also have a magnetic coupling (e.g., M), which may contribute to a feedback network within the packaged transistor device 100, deteriorating its performance.

Figure 3:
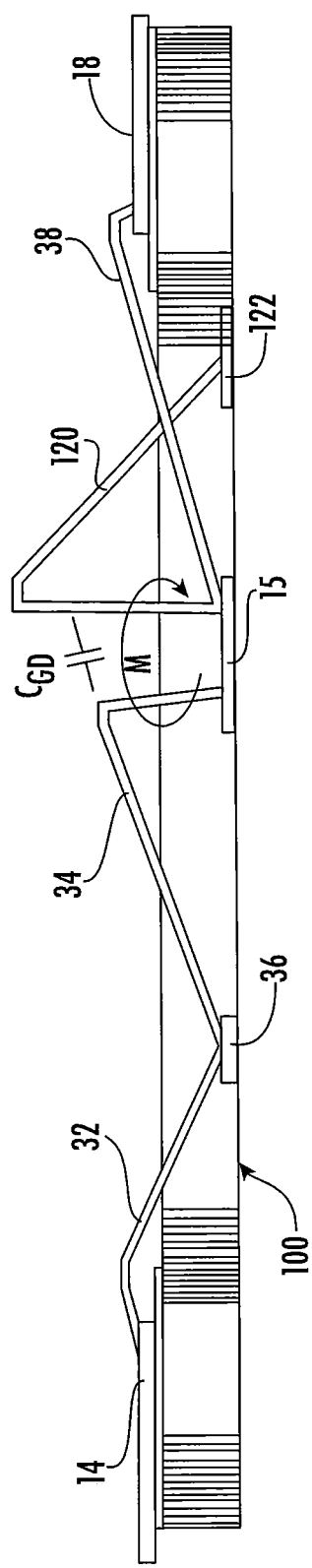
FIG. 3 is a schematic side view of a packaged transistor device incorporating bond wires that illustrates a parasitic coupling that may occur therein.

FIG. 3 is a schematic side view of the packaged transistor device 100 incorporating bond wires that illustrates a parasitic coupling that may occur between the bond wires. The packaged transistor device 100 includes the input lead 14 coupled to the first terminal of the capacitor 36 via bond wire 32, and the first terminal of the capacitor 36 coupled to transistor 15 via bond wire 34. The transistor 15 is coupled to a first terminal of the capacitor 122 via bond wire 120 and to the output lead 18 via bond wire 38. As illustrated in FIG. 3, the bond wire 120 and bond wire 34 may be arranged such that they are capacitively and magnetically coupled to each other. For example, input bond wire 34 may be capacitively coupled to output bond wire 120 and/or output bond wire 38 by a capacitance Cgd. In addition, input bond wire 34 may be magnetically coupled to output bond wire 120 and/or output bond wire 38 by a magnetic coupling M. The capacitive coupling Cgd and/or the magnetic coupling M may create and/or magnify a feedback network within the packaged transistor device 100 that may reduce a performance and/or reduce stability of the packaged transistor device 100.

Figure 4:
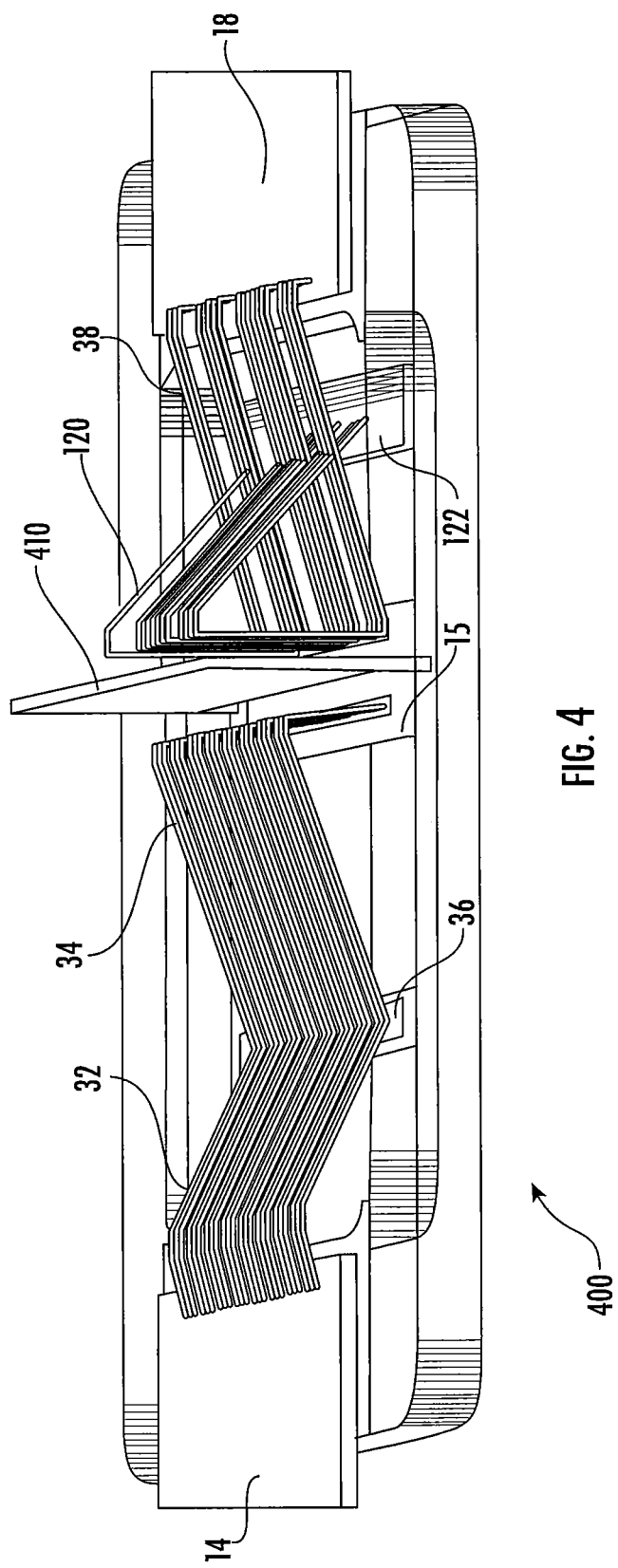
FIG. 4 is a perspective view of a packaged transistor device according to the invention that utilizes an isolation material to reduce the effect of a coupling between input and output bond wires.
Figure 5:
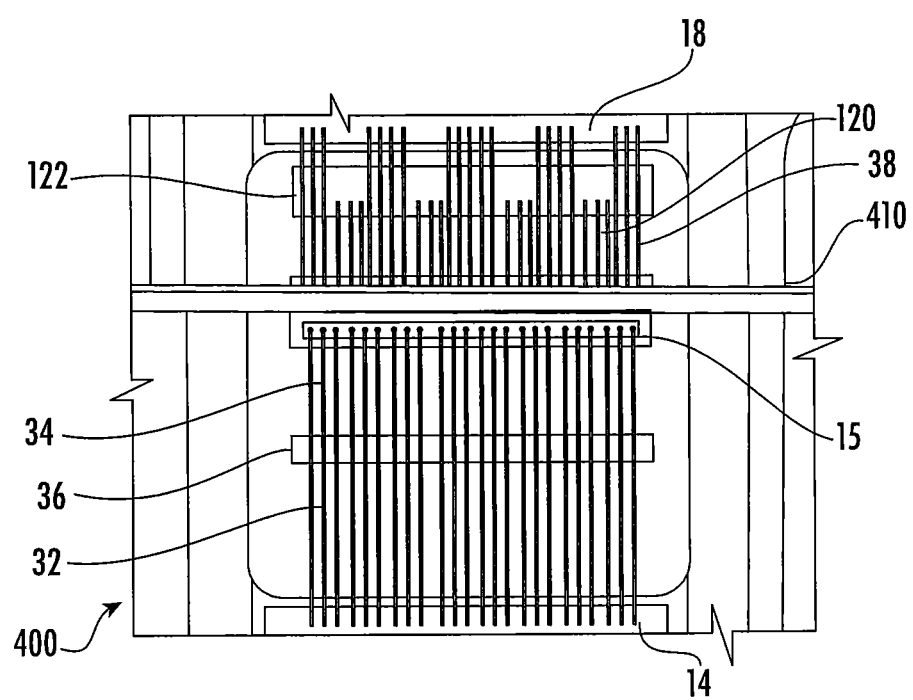
FIG. 5 is a schematic view of a prototype packaged transistor device incorporating the isolation material illustrated in the embodiment of FIG. 4.

FIG. 4 is a perspective view of a packaged transistor device 400 according to the invention that utilizes an isolation material 410 to reduce the effect of a coupling between input and output bond wires. FIG. 5 is a schematic view of a prototype packaged transistor device 400 incorporating the isolation material 410 illustrated in the embodiment of FIG. 4.

The packaged transistor device 400 of FIG. 4 is similar, in many respects, to the packaged transistor device 100 of FIGS. 2A, 2B, and 3. As illustrated in FIG. 4, the packaged transistor device 400 may include an input lead 14 coupled to a first terminal of the capacitor 36 via a bond wire 32, and the first terminal of the capacitor 36 may be coupled to a transistor 15 via a bond wire 34. The transistor 15 may be coupled to the first terminal of a capacitor 122 via bond wire 120 and to an output lead 18 via bond wire 38. At least one of the bond wire 34, bond wire 120, and/or bond wire 38 may extend above a top surface of the transistor 15.

Referring to FIGS. 4 and 5, embodiments of the invention may insert an isolation material 410 between the input bond wires (e.g., bond wire 34) that are coupled to an input of the transistor 15 and the output bond wires (e.g., bond wire 120 and/or bond wire 38) that are coupled to an output of the transistor 15. The isolation material 410 may extend on a top surface of the transistor 15, and at least a portion of the isolation material 410 may be physically between the input bond wires and the output bond wires (e.g., above the transistor 15). As used herein, a first element is physically between a second element and a third element when a straight line from a portion of the second element to a portion of the third element would intersect the first element. The isolation material 410 may reduce a capacitive and/or magnetic coupling between the input bond wire(s) and the output bond wire(s). In some embodiments, the isolation material 410 may be configured to provide an electromagnetic shield between the input bond wire and the output bond wire.

In some embodiments, the isolation material 410 may be constructed of a conductive material so as to form a conductive isolation material 410. The conductive isolation material 410 may be coupled to a reference voltage source (e.g., ground). For example, the conductive isolation material 410 may be coupled to a grounded conducting flange, a grounded pad on the base of the packaged transistor device 400, and/or other element of the packaged transistor device 400 capable of providing the ground signal. In some embodiments, the conductive isolation material 410 may be coupled to a pad or other connective element that is provided on a top surface of the transistor 15. The pad may be connected to a reference signal (e.g., ground) via internal connections of the transistor 15. In some embodiments, the conductive isolation material 410 may be provided so as to be electrically floating as opposed to coupled to ground. In some embodiments, the isolation material 410 may include a metal, a conductive metal nitride, a conductive metal oxide, or a combination of the above materials. For example, the isolation material 410 may include tungsten (W), tungsten nitride (WN), gold (Au), silver (Ag), copper (Cu), aluminium (Al), titanium aluminium nitride (TiAlN), iridium (Ir), platinum (Pt), palladium (Pd), ruthenium (Ru), zirconium (Zr), rhodium (Rh), nickel (Ni), cobalt (Co), chrome (Cr), tin (Sn), zinc (Zn), indium tin oxide (ITO), an alloy of the above metals, or a combination of the above metals. In some embodiments, the isolation material 410 may include non-conductive material plated and/or coated with a conductive material (e.g., a metal or metal-containing substance).

Though the isolation material 410 may be a conductive isolation material, the present invention is not limited thereto. In some embodiments, the isolation material 410 may include dielectric material capable of absorbing microwave and/or RF emissions. In some embodiments the isolation material 410 may be formed of a lossy dielectric. The lossy dielectric may be configured to absorb and/or reduce electromagnetic waves such as those forming the coupling between the input and output bond wires. Lossy dielectrics which may be useful as materials in the isolation material 410 may include lossy dielectrics having a loss tangent greater than 0.1. The loss tangent, also known as tan δ, is a ratio between the real and imaginary parts of the dielectric permittivity. In some embodiments, the loss tangent for the lossy dielectric being used as the isolation material 410 may be based on the operating frequency of the transistor device 400. Examples of lossy dielectrics may include dielectrics containing carbon.

In some embodiments, the isolation material 410 may include a magnetic material, such as, for example, ferrite and/or nickel.

The isolation material 410 may extend in a first direction that is substantially orthogonal to the input bond wires (e.g., bond wires 34) and/or the output bond wires (e.g., bond wires 38 and/or 120) which are connected to the transistor 15. The control terminal of the transistor 15 (e.g. the gate terminal) may be on a first side of the transistor 15 and the output terminal (e.g., the drain terminal) may be on a second side of the transistor 15, opposite the first side. The input bond wires (e.g., bond wires 34) may be connected to the input terminal of the transistor 15 on the first side. The output bond wires (e.g., bond wires 38 and/or 120) may be connected to the output terminal of the transistor 15 on the second side.

In FIG. 5, a prototype of the packaged transistor device 400 includes a metal shield wall as the isolation material 410. The packaged transistor device 400 of FIG. 5 was compared to conventional packaged transistor devices to determine the impact on performance of the isolation material 410.

One method of quantifying the effectiveness of the isolation material 410 is by comparing the signal responses of two transistor devices with identical matching networks, but one implemented with the isolation material 410. One example of a metric that may be analyzed includes the scattering parameter S12, which is a measure of the isolation between the input and output of the transistor device. A lower S12 value indicates a higher level of isolation between the input and the output of the transistor device. Another example of a metric that may be analyzed is the μ-factor, which quantifies the stability of the transistor device. The higher the μ-factor, the more stable a device will be. A μ-factor greater than one indicates an unconditionally stable transistor device and a μ-factor less than one indicates a potentially unstable device.

Figure 6B:
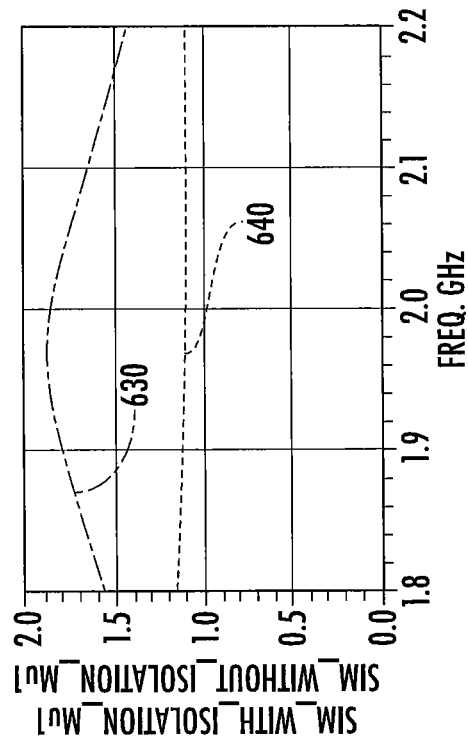
FIGS. 6A and 6B are graphs illustrating the simulated performance of a packaged transistor device according to embodiments of the invention, compared to the simulated performance of a conventional packaged transistor device.
Figure 6A:
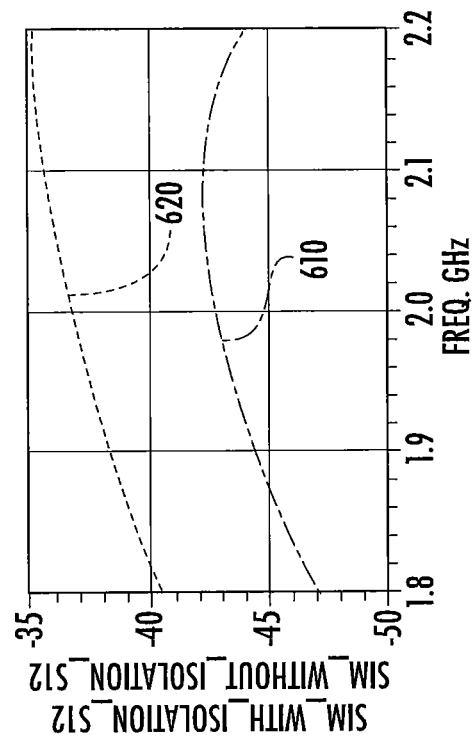

FIGS. 6A and 6B are graphs illustrating the simulated performance of the packaged transistor device 400 compared to the simulated performance of a conventional packaged transistor device 100, such as the one illustrated in FIGS. 2A and 2B.

FIGS. 6A and 6B show the simulated S12 and μ-factor in the frequency band of interest for the packaged transistor device 400 with an isolation material 410 and the packaged transistor device without the isolation material 410. The simulated device of FIGS. 6A and 6B was designed for the 2.1-2.2 GHz frequency band. FIG. 6A illustrates the S12 simulated performance 610 for the transistor device with the isolation material 410 and the S12 simulated performance 620 for the transistor device without the isolation material 410. FIG. 6A illustrates that adding the isolation material 410 provides approximately 7 dB more isolation at 2.14 GHz compared to a packaged transistor device without the isolation material 410.

FIG. 6B illustrates the μ-factor simulated performance 630 for the transistor device with the isolation material 410 and the μ-factor simulated performance 640 for the transistor device without the isolation material 410. FIG. 6B shows the μ-factor has increased from 1.08 to 1.55 within the frequency band of interest based on the addition of the isolation material 410, indicating a more stable device.

Figure 7B:
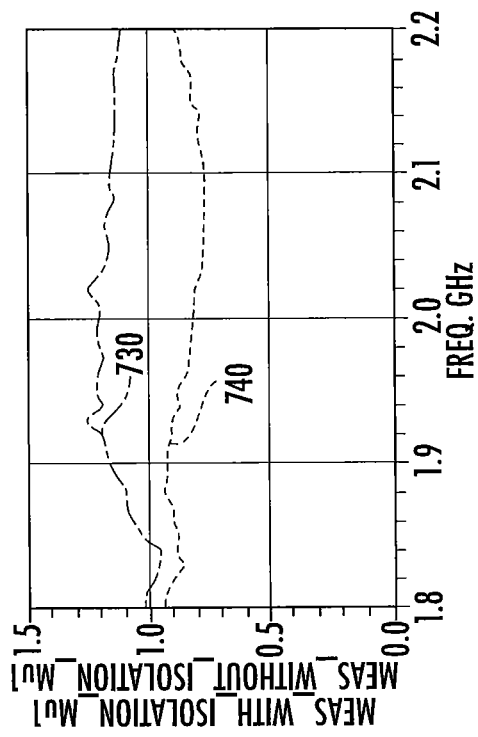
FIGS. 7A and 7B are graphs illustrating the measured performance of the prototype packaged transistor device of FIG. 5 incorporating the isolation material as compared to a conventional packaged transistor device that is identical thereto except that it does not include the isolation material.
Figure 7A:
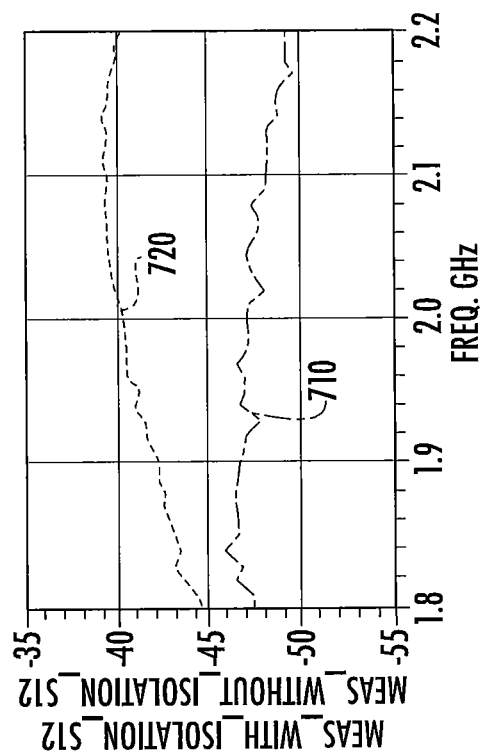

FIGS. 7A and 7B are graphs illustrating the measured performance of the prototype packaged transistor device 400 of FIG. 5 incorporating the isolation material 410 as compared to a conventional packaged transistor device without the isolation material 410, such as the packaged transistor device 100 illustrated in FIGS. 2A and 2B. FIG. 7A shows the packaged transistor device 400 of FIG. 5 incorporating the isolation material 410 has an measured S12 performance 710 that contributes to 9 dB more in S12 isolation at 2.14 GHz than the measured S12 performance 720 of the conventional packaged transistor device 100. FIG. 7B shows that the packaged transistor device 400 of FIG. 5 incorporating the isolation material 410 has a measured μ-factor performance 730 at 2.14 GHz that increases the μ-factor from 0.79 to 1.14 as compared to the measured μ-factor performance 740 of the conventional packaged transistor device 100.

Though FIGS. 4 and 5 illustrate the use of a metal wall as the isolation material 410, it will be understood that other configurations of the isolation material 410 may be used without deviating from the invention. For example, in some embodiments, the isolation material may be formed of a mesh, such as a metal mesh. In some embodiments, the isolation material 410 may be formed of individual bond wires. FIG. 8A is a perspective view of a packaged transistor device 800 incorporating isolation bond wires 810 as an isolation material 410, according to embodiments of the invention. FIG. 8B is a cross-sectional view illustrating the configuration of the isolation material 410 of the packaged transistor device 800 of FIG. 8A.

The configuration of the input and output bond wires of the packaged transistor device 800 may be substantially similar to the packaged transistor device 400 illustrated in FIG. 4. As illustrated in FIG. 8A, the packaged transistor device 800 may include an input lead 14 coupled to a capacitor 36 via a bond wire 32, and the capacitor 36 may be coupled to a transistor 15 via a bond wire 34. The transistor 15 may be coupled to a capacitor 122 via bond wire 120 and to an output lead 18 via bond wire 38. At least one of the bond wire 34, bond wire 120, and/or bond wire 38 may extend above a top surface of the transistor 15.

Referring to FIGS. 8A and 8B, the isolation material 410 may be composed of a plurality of isolation bond wires 810 which may be connected to a reference voltage source (e.g., a ground signal). In some embodiments, the isolation bond wires 810 of the isolation material 410 may extend from a first side of the transistor 15 to a second side of the transistor 15 in a first direction. The input bond wires (e.g., bond wires 34) may extend in a second direction that extends from the input lead 14 to a third side of the transistor 15. The output bond wires (e.g., bond wires 38 and/or 120) may extend in the second direction (e.g., in a direction that extends from a fourth side of the transistor 15 to the output lead 18). In some embodiments, the first direction may be orthogonal to the second direction. A portion of at least one of the isolation bond wires 810 may be physically between the input bond wires and the output bond wires (e.g., above the transistor 15).

In some embodiments, the isolation bond wires 810 may be connected to a base and/or substrate of the packaged transistor device 800 on the first side of the transistor 15, may extend on the transistor 15 at a height above the transistor 15, and/or may be connected to the base and/or substrate of the packaged transistor device 800 on the second side of the transistor 15. In some embodiments, portions of individual ones of the plurality of isolation bond wires 810 may overlap one another (e.g., in a horizontal and/or vertical direction), though the present invention is not limited thereto.

Though FIGS. 8A and 8B illustrate the isolation bond wires 810 connected to the base and/or substrate, the present invention is not limited thereto. In some embodiments, the transistor 15 may have pads and/or other connective element on its surface that are connected to a reference signal (e.g., ground) through internal or external connections of the transistor 15 (e.g., to the substrate). FIG. 8C illustrates an embodiment in which the plurality of bond wires 810 are connected to one or more ground pads 182. In some embodiments, the plurality of isolation bond wires 810 may be connected to the ground pads 182 on a surface of the transistor 15, such as, for example, a top surface or a side surface.

Figure 9A:
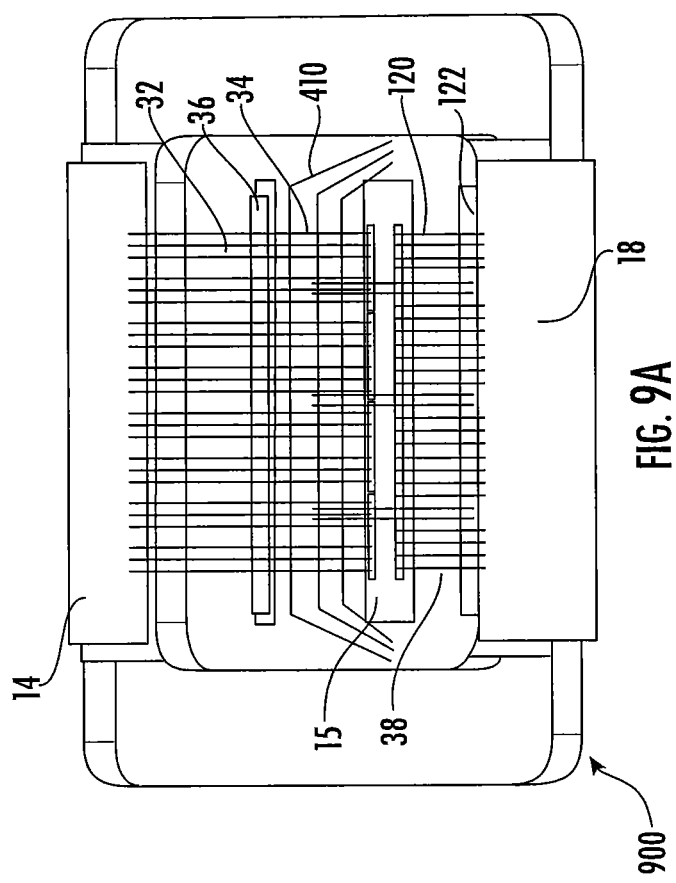
FIG. 9A is a perspective view of a packaged transistor device incorporating isolation bond wires as an isolation material according to further embodiments of the invention.
Figure 9B:
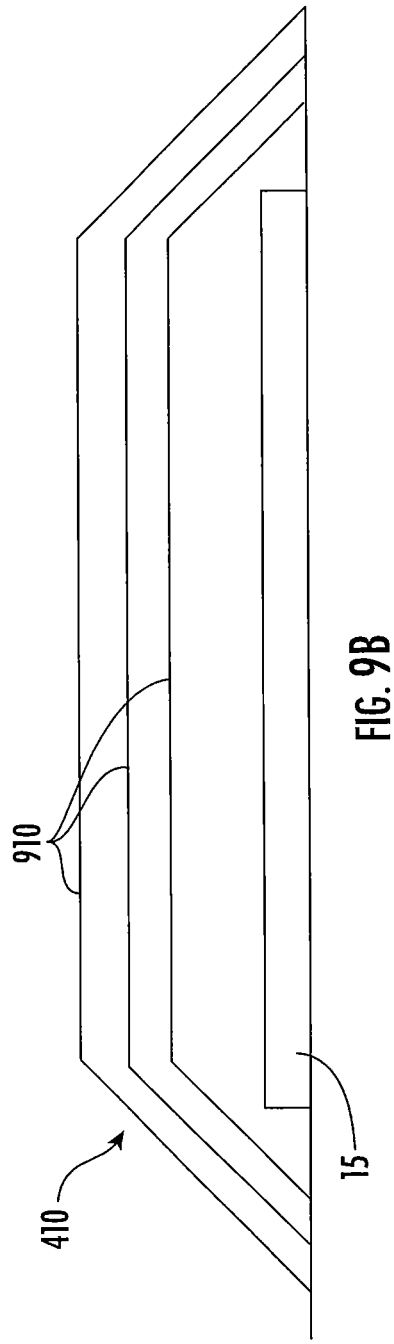
FIG. 9B is a cross-sectional view illustrating the configuration of the isolation material of the packaged transistor device of FIG. 9A.

FIG. 9A is a perspective view of a packaged transistor device 900 incorporating isolation bond wires 820 as an isolation material 410, according to embodiments of the invention. FIG. 9B is a cross-sectional view illustrating the configuration of the isolation material 410 of the packaged transistor device 900 of FIG. 9A.

The configuration of the input and output bond wires of the packaged transistor device 900 may be substantially similar to the packaged transistor device 400 illustrated in FIGS. 4 and 8. As illustrated in FIG. 9A, the packaged transistor device 900 may include an input lead 14 coupled to a capacitor 36 via a bond wire 32, and the capacitor 36 may be coupled to a transistor 15 via a bond wire 34. The transistor 15 may be coupled to a capacitor 122 via bond wire 120 and to an output lead 18 via bond wire 38. At least one of the bond wire 34, bond wire 120, and/or bond wire 38 may extend above a top surface of the transistor 15.

Referring to FIGS. 9A and 9B, the isolation material 410 may be composed of a plurality of isolation bond wires 910 which may be connected to a reference voltage source (e.g., a ground signal). The isolation bond wires 910 of the isolation material 410 may extend in a first direction from a first side of the transistor 15 to a second side of the transistor 15. The input bond wires (e.g., bond wires 34) may extend in a second direction (e.g., in a direction from the input lead 14 to a third side of the transistor 15). The output bond wires (e.g., bond wires 38 and/or 120) may extend in the second direction (e.g., in a direction from a fourth side of the transistor 15 to the output lead 18). In some embodiments, the first direction may be orthogonal to the second direction. A portion of at least one of the isolation bond wires 910 may be disposed between the input bond wires and the output bond wires (e.g., above the transistor 15).

In some embodiments, the isolation bond wires 910 may be connected to a base and/or substrate of the packaged transistor device 900 on the first side of the transistor 15, may extend on the transistor 15 at a height above the transistor 15, and/or may be connected to the base and/or substrate of the packaged transistor device 900 on the second side of the transistor 15. In some embodiments, a first one of the plurality of isolation bond wires 910 may extend at a level that is higher (e.g., farther from the transistor 15) than a second one of the plurality of isolation bond wires 910. In some embodiments, portions of individual ones of the plurality of isolation bond wires 910 may extend substantially parallel to one another, though the present invention is not limited thereto.

Figure 9C:
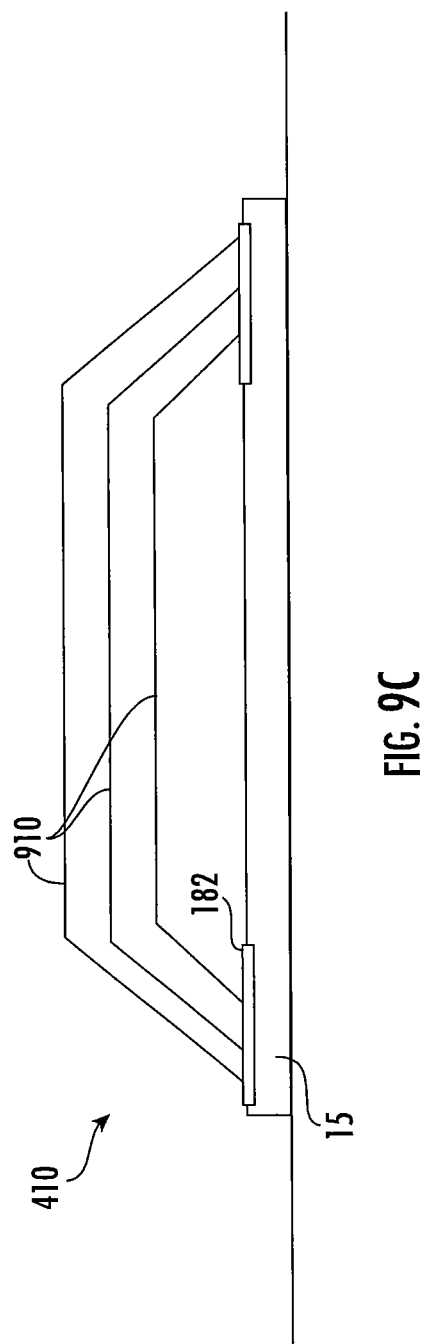
FIG. 9C is a cross-sectional view illustrating an additional configuration of the isolation material of the packaged transistor device of FIG. 9A.

Though FIGS. 9A and 9B illustrate the isolation bond wires 910 connected to the base and/or substrate, the present invention is not limited thereto. FIG. 9C illustrates an embodiment in which the plurality of bond wires 910 are connected to one or more ground pads 182. In some embodiments, the transistor 15 may have ground pads 182 and/or other connective elements on its surface that are connected to a reference signal (e.g., ground) through internal or external connections of the transistor 15 (e.g., to the substrate). In some embodiments, the plurality of isolation bond wires 910 may be connected to the ground pads 182 on a surface of the transistor 15, such as, for example, a top surface or a side surface.

Figure 10A:
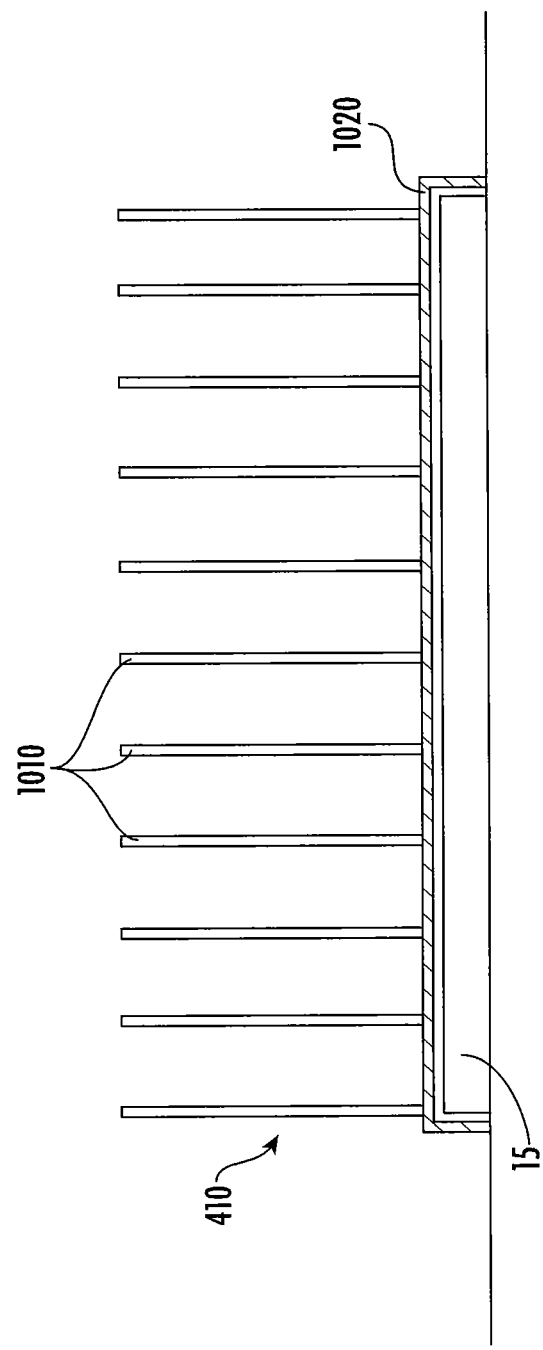

FIG. 10A is a schematic cross-sectional view illustrating an isolation material 410 according to further embodiments of the invention. As illustrated in FIG. 10A, the isolation material 410 may be composed of one or more isolation segments 1010. In some embodiments, the isolation segments 1010 may extend away from the top surface of the transistor 15 in a direction away from the transistor 15 (e.g., in a vertical direction). In some embodiments, the isolation segments 1010 may extend in a direction that is substantially perpendicular to the top surface of the transistor 15. It will be understood that the isolation material 410 illustrated in FIG. 10A may be disposed on the transistor 15 relative to other elements of a packaged transistor device, such as input and output bond wires, in a way similar to the packaged transistor devices of FIGS. 4, 8A, and 9A. That is to say that the isolation segments 1010 of the isolation material 410 may be disposed between input and output bond wires above the transistor 15. In some embodiments, the isolation segments 1010 may include a metal, a conductive metal nitride, a conductive metal oxide, or a combination of the above materials. For example, the isolation segments may include tungsten (W), tungsten nitride (WN), gold (Au), silver (Ag), copper (Cu), aluminium (Al), titanium aluminium nitride (TiAlN), iridium (Ir), platinum (Pt), palladium (Pd), ruthenium (Ru), zirconium (Zr), rhodium (Rh), nickel (Ni), cobalt (Co), chrome (Cr), tin (Sn), zinc (Zn), indium tin oxide (ITO), an alloy of the above metals, or a combination of the above metals. In some embodiments, the isolation segments 1010 may include a lossy dielectric and/or a magnetic material.

In some embodiments, the isolation segments 1010 may be formed on a base isolation segment 1020, though the present invention is not limited thereto. In some embodiments, the base isolation segment 1020 may be connected to a base and/or substrate on one side of the transistor 15, may extend on the transistor 15 above the transistor 15, and/or may be connected to the base and/or substrate on a second side of the transistor 15. In some embodiments, the base isolation segment 1020 may be one of a plurality of bond wires, such as the plurality of bond wires 910 illustrated in FIGS. 9A and 9B. Though FIG. 10A illustrates the base isolation segment 1020 connected to the base and/or substrate, the present invention is not limited thereto. In some embodiments, the transistor 15 may have pads and/or other connective element on its surface that are connected to a reference signal (e.g., ground) through internal or external connections of the transistor 15 (e.g., to the substrate). FIG. 10B illustrates an embodiment in with the transistor 15 has ground pads 182 on a top surface of the transistor 15. In some embodiments, the base isolation segment 1020 may be connected to the ground pads 182 on the surface of the transistor 15. In some embodiments, at least one end of the base isolation segment 1020 may be connected to a reference signal (e.g., a ground signal). In some embodiments, the base isolation segment 1020 may be a bond wire. In some embodiments, the base isolation segment 1020 may be a metal trace and/or segment formed on the top surface of the transistor 15.

Though FIGS. 4, 8A, and 9A illustrate embodiments of a packaged transistor device 400, 800, 900 which incorporate an air cavity, the present invention is not limited thereto. In some embodiments, the isolation material 410 may be formed within a plastic overmold that is used to encase the components of the packaged transistor device. For example, in an air cavity configuration, the isolation material 410 may be disposed on a transistor 15, such as through connection with a sidewall of the air cavity and/or through a connection to a base of the packaged transistor device. In an overmold configuration, the isolation material 410 may be similarly disposed on the transistor 15 as in the air cavity configuration, and/or may be disposed on the transistor 15 within the overmold that covers the transistor 15. Thus, the isolation material 410 described herein may be used in multiple configurations of a packaged transistor device.

FIGS. 11A-14B illustrate example techniques for manufacturing a packaged transistor device 1100 utilizing a plastic overmold according to some embodiments of the invention.

Figure 11A:
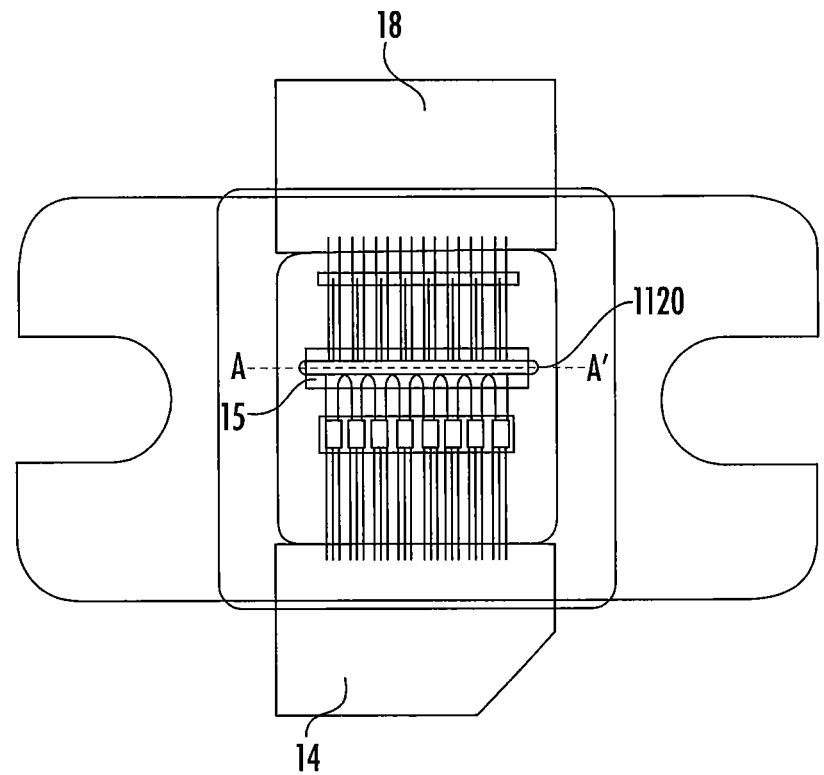
FIGS. 11A-14B illustrate example embodiments for manufacturing a packaged transistor device utilizing a plastic overmold according to some embodiments of the invention.
Figure 11B:
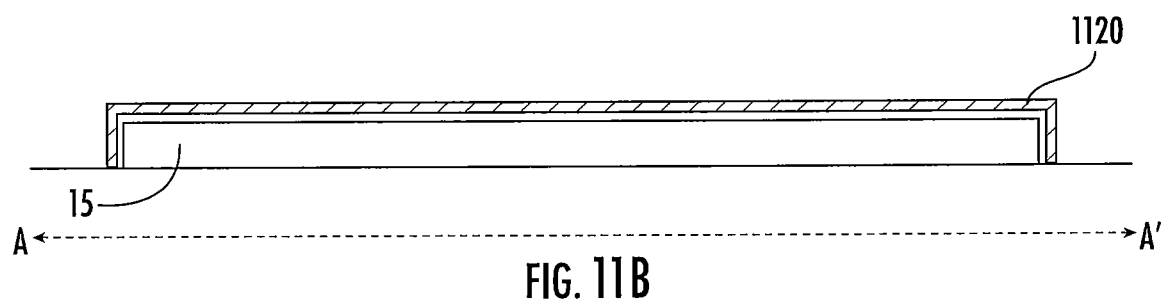

FIG. 11A is a plan view of a transistor configuration, and FIG. 11B is a cross-sectional view taken along the line A-A' of FIG. 11A. Referring to FIGS. 11A and 11B, a transistor configuration incorporating a transistor 15 coupled to an input lead 14 and output lead 18 may be provided. The transistor 15 may be coupled to a matching network and/or harmonic reducer utilizing bond wires as inductive elements, as described herein. A base isolation segment 1120 may be provided on the transistor 15. In some embodiments, the base isolation segment 1120 may be a bond wire. In some embodiments, the base isolation segment 1120 may be connected to a base and/or substrate on one side of the transistor 15, may extend on the transistor 15 above the transistor 15, and may be connected to the base and/or substrate on a second side of the transistor 15. In some embodiments, the base isolation segment 1120 may be connected to a pad on the surface of the transistor 15, where the pad is further connected to the reference signal (e.g., ground) via internal connections of the transistor 15 and/or external connections. At least one side of the base isolation segment 1120 may be connected to a reference signal (e.g., a ground signal). In some embodiments, such as, for example, embodiments incorporating a pad connected to a ground signal on the top surface of the transistor 15, the base isolation segment 1120 may be omitted.

Figure 12A:
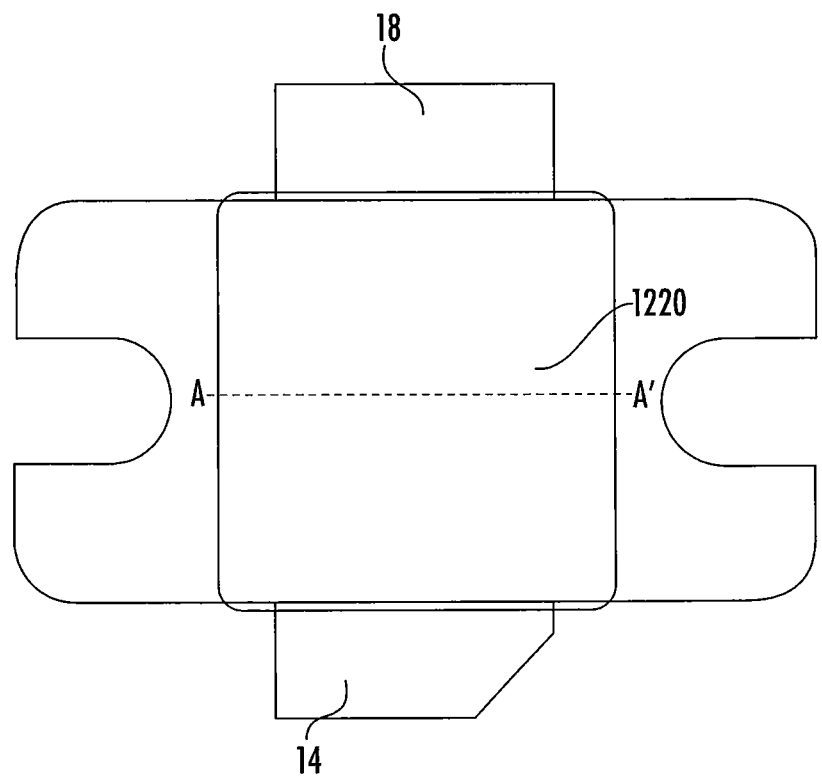
Figure 12B:
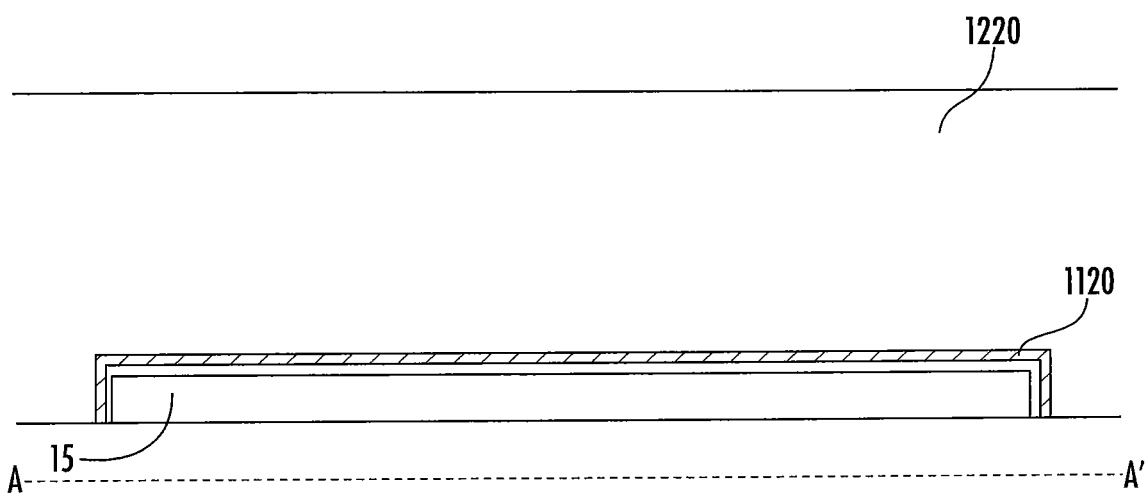

Referring to FIGS. 12A and 12B, where FIG. 12B is a cross-sectional view taken along the line A-A' of FIG. 12A, a plastic overmold 1220 may be formed on the transistor configuration. The plastic overmold 1220 may encase elements of the transistor configuration, including the base isolation segment 1120, if present. The plastic overmold 1220 may be constructed of a plastic or a plastic polymer compound.

Figure 13A:
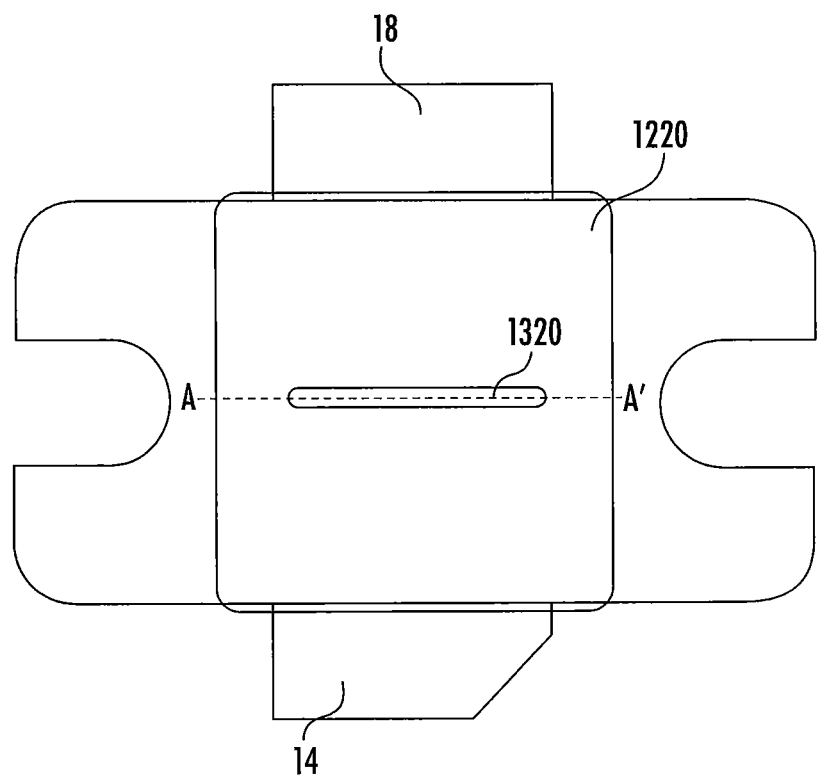
Figure 13B:
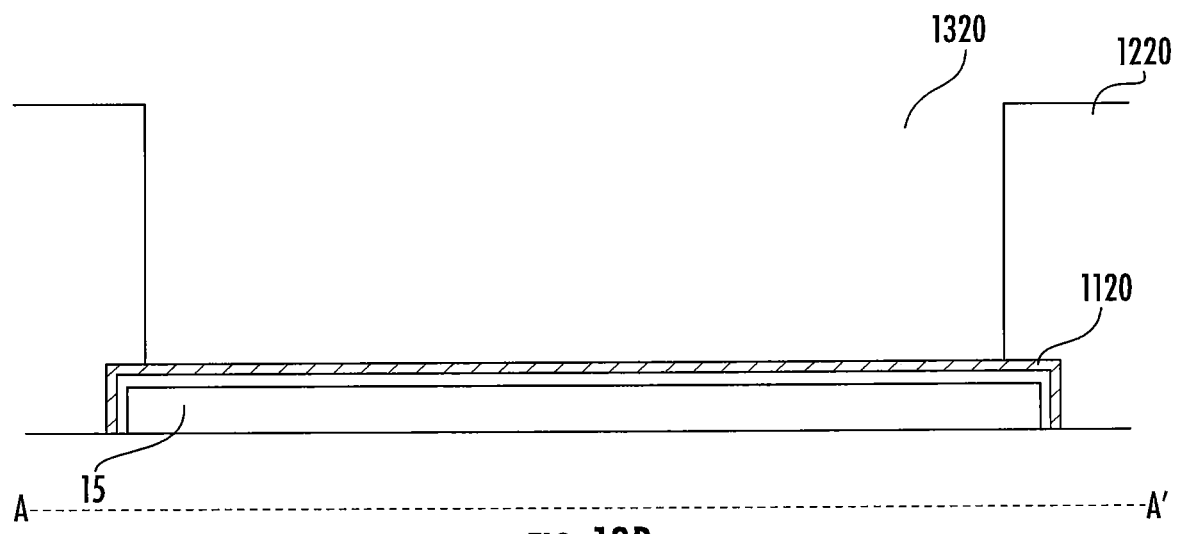

Referring to FIGS. 13A and 13B, where FIG. 13B is a cross-sectional view taken along the line A-A' of FIG. 13A, a recess 1320 may be formed in the plastic overmold 1220. At least a portion of the recess 1320 may extend from a surface of the plastic overmold 1220 towards the base isolation segment 1120. In some embodiments, the recess 1320 may extend to expose the base isolation segment 1120, but the present invention is not limited thereto. In some embodiments, such as, for example, embodiments incorporating a pad connected to a ground signal on the top surface of the transistor 15, the recess 1320 may extend to expose the pad. In some embodiments, the recess 1320 may be formed to extend in a same direction as the base isolation segment 1120.

Figure 14A:
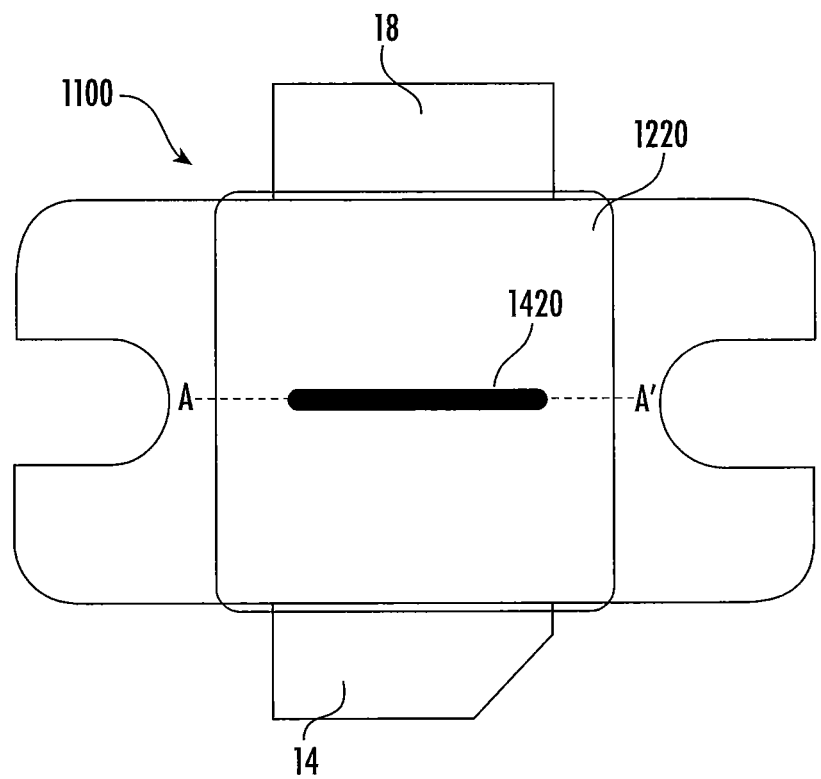
Figure 14B:
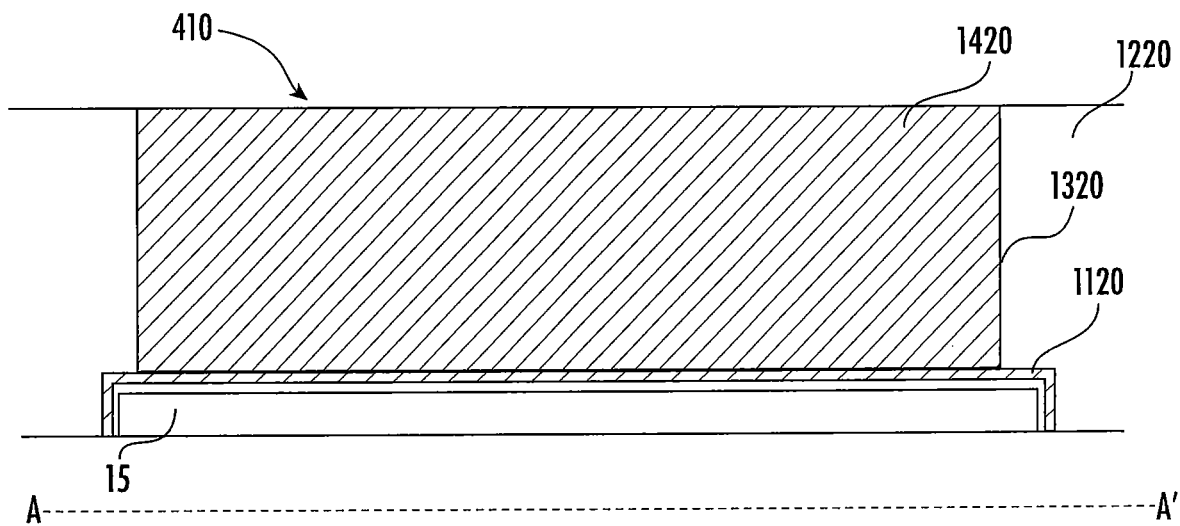

Referring to FIGS. 14A and 14B, where FIG. 14B is a cross-sectional view taken along the line A-A' of FIG. 14A, a conductive material 1420 may be disposed within the recess 1320 to form the packaged transistor device 1100 according to embodiments of the invention. In some embodiments, the conductive material 1420 may fill the recess 1320. The conductive material 1420 may include, for example, a metal or metal containing material (e.g., silver epoxy). In some embodiments, the conductive material 1420 may include dielectric material capable of absorbing microwave and/or RF emissions.

In some embodiments, the conductive material 1420 may be electrically coupled to the base isolation segment 1120 so as to form the isolation material 410 within the plastic overmold 1220. In some embodiments, the conductive material 1420 may be separated from the base isolation segment 1120. In some embodiments, such as, for example, embodiments incorporating a pad connected to a ground signal on the top surface of the transistor 15, the conductive material 1420 may be formed so as to be in electrical contact with the pad.

Figure 15A:
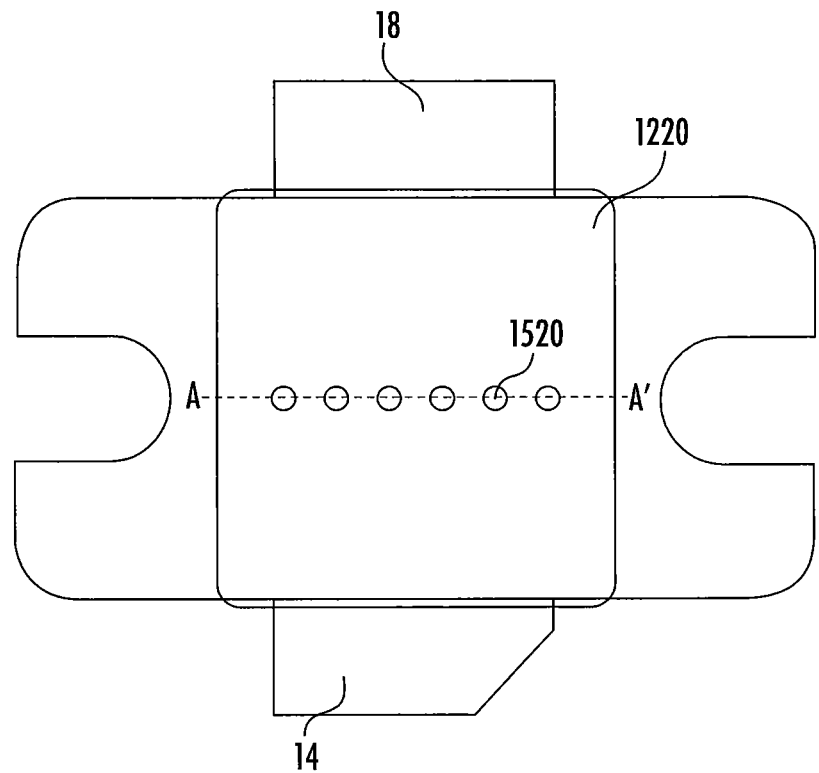
FIGS. 15A-16B illustrate additional example techniques for manufacturing a packaged transistor device utilizing a plastic overmold according to some embodiments of the invention.

FIGS. 15A-16B illustrate additional example techniques for manufacturing a packaged transistor device, according to some embodiments of the invention. The embodiments illustrated in FIGS. 15A-16B may be preceded by operations similar to those discussed herein with respect to FIGS. 11A-12B. Referring to FIGS. 15A and 15B, where FIG. 15B is a cross-sectional view taken along the line A-A' of FIG. 15A, a plurality of recesses 1520 may be formed in the plastic overmold 1220. At least one of the plurality of recesses 1520 may extend from a surface of the plastic overmold 1220 to the base isolation segment 1120. In some embodiments, respective ones of the plurality of recesses 1520 may be formed in a columnar shape that extends away from a top surface of the transistor 15.

Figure 16A:
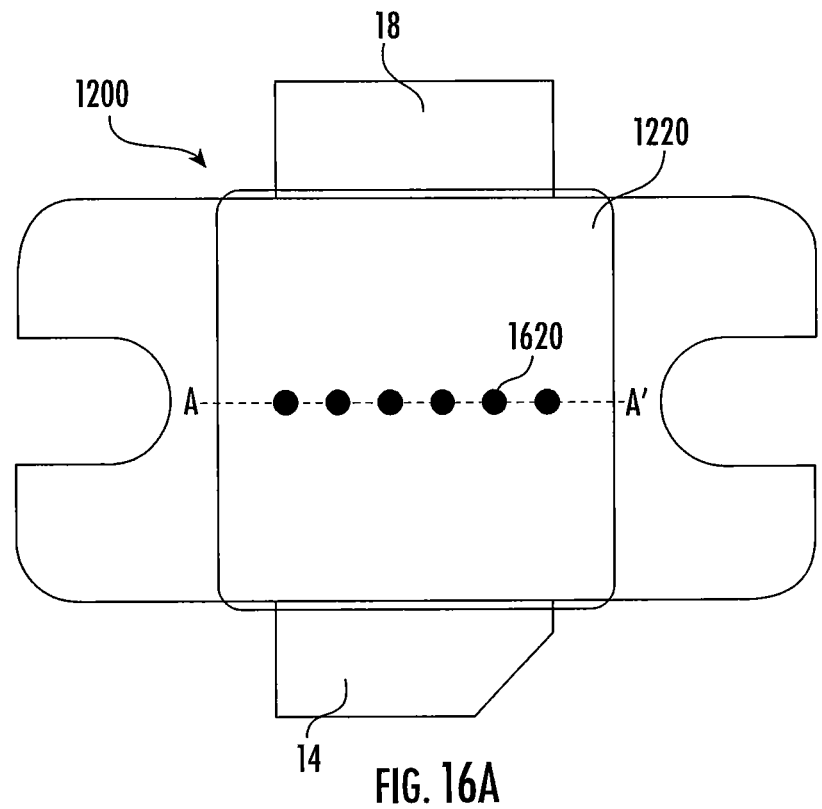
Figure 16B:
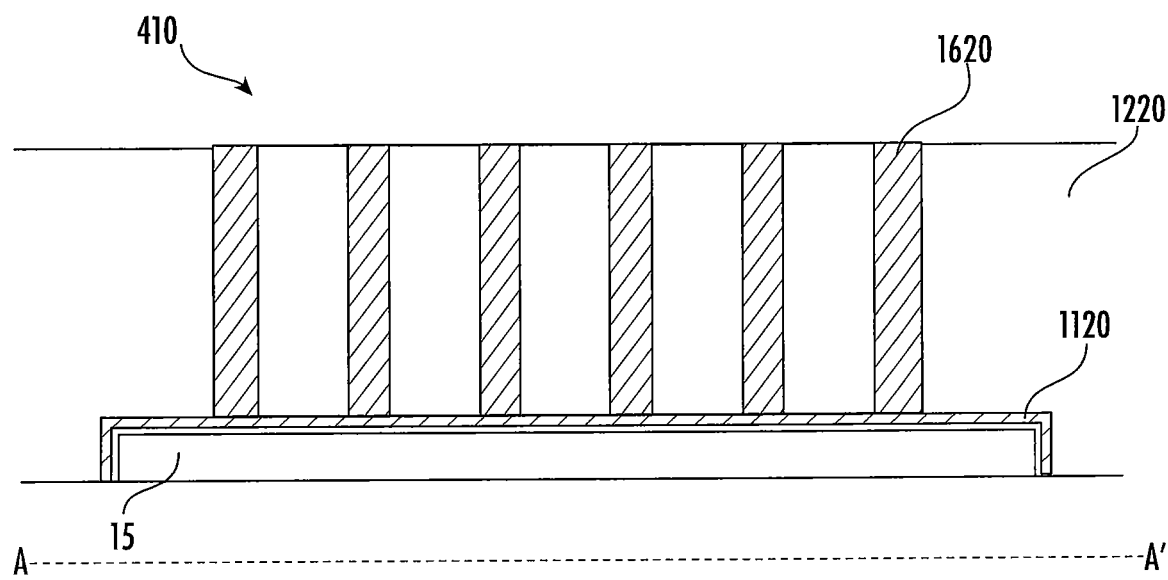

Referring to FIGS. 16A and 16B, where FIG. 16B is a cross-sectional view taken along the line A-A' of FIG. 16A, a conductive material 1620 may be disposed within the plurality of recesses 1520 to form the packaged transistor device 1100 according to embodiments of the invention. In some embodiments, the conductive material 1620 may fill one or more of the plurality of recesses 1520. The conductive material 1620 may include, for example, a metal or metal containing material (e.g., silver epoxy). In some embodiments, the conductive material 1620 may include dielectric material capable of absorbing microwave and/or RF emissions. In some embodiments, the conductive material 1620 within respective ones of the plurality of recesses 1520 may be electrically coupled to the base isolation segment 1120 so as to form the isolation material 410 within the plastic overmold 1220.

In some embodiments, the base isolation segment 1120 may be optional.

Figure 15B:
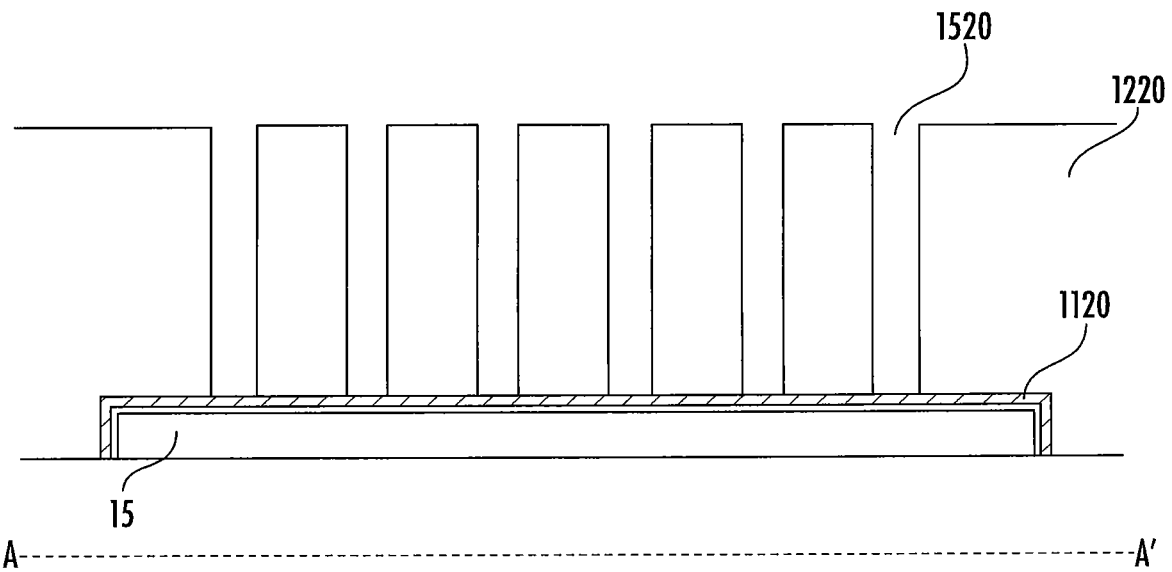

For example, the plurality of recesses 1520 may be formed as discussed with respect to FIGS. 15A and 15B. Either before or after filling the plurality of recesses 1520, a connecting recess (e.g., a groove) may be formed at a top surface of the plastic overmold 1220. The connecting recess may extend to connect top surfaces of the plurality of recesses 1520. The plurality of recesses 1520 and the connecting recess may be filled with the conductive material 1620 to form the isolation material 410. The isolation material 410 may be further connected to a reference signal (e.g., ground) or left floating to minimize and/or reduce a coupling between the input and output bond wires.

Pursuant to embodiments of the present invention, packaged transistor devices are provided that include a transistor on a base of the packaged transistor device, the transistor comprising a control terminal and an output terminal, a first bond wire electrically coupled between an input lead and the control terminal of the transistor, a second bond wire electrically coupled between an output lead and the output terminal of the transistor, and an isolation material that is and physically between the first bond wire and the second bond wire, wherein the isolation material is configured to reduce a coupling between the first bond wire and the second bond wire.

In some embodiments, the transistor comprises a plurality of unit cell transistors that are electrically connected in parallel.

In some embodiments, the isolation material is a conductive isolation material, a magnetic isolation material, or a lossy dielectric isolation material. The lossy dielectric isolation material may include a loss tangent greater than 0.1.

In some embodiments, the packaged transistor device may further include a package that houses the transistor, with the input lead and the output lead extending from the package.

In some embodiments, a portion of the isolation material contacts the package.

In some embodiments, the package comprises an air cavity, and at least a portion of the first bond wire and at least a portion of the second bond wire extend into the air cavity.

In some embodiments, the package includes a plastic overmold.

In some embodiments, the isolation material is disposed above the transistor.

In some embodiments, the control terminal is on a first side of the transistor and the output terminal is on a second side of the transistor, opposite the first side, the plurality of third bond wires extend from a third side of the transistor to a fourth side of the transistor, and the third side and fourth side of the transistor are different than the first side and the second side.

In some embodiments, a first portion of a first one of the third bond wires extends above the transistor at a first height, and a second portion of a second one of the third bond wires extends above the transistor at a second height that is greater than the first height.

In some embodiments, the isolation material includes a plurality of metal segments.

In some embodiments, the plurality of metal segments extend in a direction substantially perpendicular to a top surface of the transistor.

In some embodiments, the isolation material comprises a metal wall.

In some embodiments, the metal wall extends in a direction substantially perpendicular to a top surface of the transistor.

In some embodiments, the isolation material is configured to be connected to a ground signal.

In some embodiments, the isolation material is configured to be electrically floated.

In some embodiments, the isolation material comprises a metal mesh.

In some embodiments, the packaged transistor device further includes an input matching circuit that is electrically coupled between the input lead and the control terminal, and the first bond wire is an inductive element within the input matching circuit.

Pursuant to further embodiments of the present invention, a packaged transistor device is provided that includes a transistor on a base of the packaged transistor device, the transistor comprising a control terminal and an output terminal on opposite sides of the transistor, a first inductor connected to the control terminal, the first inductor comprising a first portion that extends at a first level that is farther from the base than a top surface of the transistor, a second inductor connected to the output terminal, the second inductor comprising a second portion that extends at a second level that is farther from the base than the top surface of the transistor, and an isolation material that is between the first portion and the second portion, where the isolation material is configured to reduce a coupling between the first inductor and the second inductor.

In some embodiments, the isolation material is electrically connected to a reference signal.

In some embodiments, the first inductor is a component of an impedance matching circuit or a harmonic reduction circuit.

In some embodiments, the packaged transistor device further includes a package that houses the transistor, with an input lead and an output lead extending from the package, and the input lead is connected to the control terminal and the output lead is connected to the output terminal.

In some embodiments, a portion of the isolation material contacts the package.

In some embodiments, the package comprises an air cavity, and at least a portion of the first inductor and at least a portion of the second inductor extend into the air cavity.

In some embodiments, the package comprises a plastic overmold.

In some embodiments, the isolation material is a conductive isolation material, a magnetic isolation material, or a lossy dielectric isolation material. In some embodiments, the lossy dielectric isolation material comprises a loss tangent greater than 0.1.

In some embodiments, the isolation material comprises a plurality of bond wires.

In some embodiments, a first portion of a first one of the bond wires extends above the transistor at a first height, and a second portion of a second one of the bond wires extends above the transistor at a second height, greater than the first height.

In some embodiments, the isolation material is disposed above the transistor.

In some embodiments, the isolation material comprises a plurality of metal segments.

In some embodiments, the plurality of metal segments extend in a direction substantially perpendicular to a top surface of the transistor.

In some embodiments, the isolation material comprises a metal wall.

Pursuant to further embodiments of the present invention, a method of manufacturing a packaged transistor device includes providing a transistor comprising a control terminal and an output terminal on opposite sides of the transistor, connecting a first bond wire to the control terminal, connecting a second bond wire to the output terminal, placing an isolation material on the transistor between the first bond wire and the second bond wire, wherein the isolation material is configured to reduce a coupling between the first bond wire and the second bond wire, and providing a package to enclose the transistor, the first bond wire, the second bond wire, and the isolation material.

In some embodiments, providing the transistor comprises providing the transistor within an air cavity of the packaged transistor device.

In some embodiments, the isolation material extends into a sidewall of the air cavity.

In some embodiments, wherein placing the isolation material on the transistor comprises providing a plurality of third bond wires between the first bond wire and the second bond wire.

In some embodiments, providing the package comprises placing a plastic overmold on the transistor, and placing the isolation material on the transistor comprises recessing the plastic overmold In some embodiments, recessing the plastic overmold includes providing a plurality of recesses into the plastic overmold, and providing a metal material into the plurality of recesses.

In some embodiments, recessing the plastic overmold includes providing a trench that extends on the transistor into the plastic overmold, and providing a metal material into the trench.

In some embodiments, the isolation material is configured to be connected to a ground signal.

In some embodiments, the isolation material is disposed above the transistor.

In some embodiments, the isolation material is a conductive isolation material, a magnetic isolation material, or a lossy dielectric isolation material.

In some embodiments, the lossy dielectric isolation material comprises a loss tangent greater than 0.1.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" "comprising," "includes," and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A packaged transistor device, comprising:
an input lead;
an output lead;
a transistor comprising a control terminal and an output terminal;
a first bond wire electrically coupled between the input lead and the control terminal of the transistor;
a second bond wire electrically coupled between the output lead and the output terminal of the transistor; and
an isolation material that is physically between the first bond wire and the second bond wire, wherein the isolation material is configured to reduce a coupling between the first bond wire and the second bond wire.

2. The packaged transistor device of claim 1, wherein the isolation material is a magnetic isolation material, a dielectric isolation material, or a conductive isolation material that is physically separated from the first bond wire and the second bond wire.

3. The packaged transistor device of claim 1, further comprising a package that houses the transistor, with the input lead and the output lead extending from the package,
wherein the package comprises an air cavity, and
wherein at least a portion of the first bond wire and at least a portion of the second bond wire extend into the air cavity.

4. The packaged transistor device of claim 1, further comprising a package that houses the transistor, with the input lead and the output lead extending from the package.

5. The packaged transistor device of claim 1, wherein the isolation material is disposed above the transistor.

6. The packaged transistor device of claim 1, wherein the isolation material comprises a plurality of third bond wires,
wherein a first portion of a first one of the third bond wires extends above the transistor at a first height, and
wherein a second portion of a second one of the third bond wires extends above the transistor at a second height that is greater than the first height.

7. The packaged transistor device of claim 1, wherein the isolation material comprises a plurality of metal segments.

8. The packaged transistor device of claim 1, wherein the isolation material is configured to be connected to a ground signal.

9. The packaged transistor device of claim 1, further comprising a package that houses the transistor, with an input lead and an output lead extending from the package,
wherein the input lead is connected to the control terminal and the output lead is connected to the output terminal,
wherein the package comprises an air cavity, and
wherein at least a portion of the first bond wire and at least a portion of the second bond wire extend into the air cavity.

10. A packaged transistor device, comprising:
a base;
a transistor on the base, the transistor comprising a control terminal and an output terminal on opposite sides of the transistor;
a first inductor connected to the control terminal, the first inductor comprising a first portion that extends at a first level that is farther from the base than a top surface of the transistor;
a second inductor connected to the output terminal, the second inductor comprising a second portion that extends at a second level that is farther from the base than the top surface of the transistor; and
an isolation material that is between the first portion and the second portion, wherein the isolation material is configured to reduce a coupling between the first inductor and the second inductor.

11. The packaged transistor device of claim 10, wherein the isolation material is a conductive isolation material that is physically separate from the first inductor and the second inductor, and
wherein the isolation material is electrically connected to a reference signal.

12. The packaged transistor device of claim 10, further comprising a package that houses the transistor, with an input lead and an output lead extending from the package, and
wherein the input lead is connected to the control terminal and the output lead is connected to the output terminal.

13. The packaged transistor device of claim 10, wherein the isolation material comprises a plurality of bond wires.

14. The packaged transistor device of claim 10, wherein the isolation material is disposed above the transistor.

15. The packaged transistor device of claim 10, wherein the isolation material comprises a plurality of metal segments, and
wherein the plurality of metal segments extend in a direction substantially perpendicular to a top surface of the transistor.

16. A method of manufacturing a packaged transistor device comprising:

providing a transistor comprising a control terminal and an output terminal on opposite sides of the transistor;
connecting a first bond wire to the control terminal;
connecting a second bond wire to the output terminal;
placing an isolation material on the transistor between the first bond wire and the second bond wire, wherein the isolation material is configured to reduce a coupling between the first bond wire and the second bond wire; and
providing a package to enclose the transistor, the first bond wire, the second bond wire, and the isolation material.

17. The method of claim 16, wherein placing the isolation material on the transistor comprises providing a plurality of third bond wires between the first bond wire and the second bond wire.

18. The method of claim 16, wherein providing the package comprises placing a polymer material on the transistor,
wherein placing the isolation material on the transistor comprises recessing the polymer material, and
wherein recessing the polymer material comprises:
providing a plurality of recesses into the polymer material; and
providing a metal material into the plurality of recesses.

19. The method of claim 16, wherein providing the package comprises placing a polymer material on the transistor,
wherein placing the isolation material on the transistor comprises recessing the polymer material, and
wherein recessing the polymer material comprises:
providing a trench that extends on the transistor into the polymer material; and
providing a metal material into the trench.

20. The method of claim 16, wherein the isolation material is a conductive isolation material that is physically separate from the first bond wire and the second bond wire, and
wherein the isolation material is configured to be connected to a ground signal.

* * * * *

UNITED STATES PATENT AND TRADEMARK OFFICE
CERTIFICATE OF CORRECTION

| | | |
|---|---|---|
| PATENT NO. | : 10,770,415 B2 | Page 1 of 1 |
| APPLICATION NO. | : 16/208821 | |
| DATED | : September 8, 2020 | |
| INVENTOR(S) | : Trang et al. | |

It is certified that error appears in the above-identified patent and that said Letters Patent is hereby corrected as shown below:

On the Title Page

(56) References Cited, U.S. PATENT DOCUMENTS, Page 2, Column 1, Line 31, Sheppard cite: Please correct "7,908,799" to read -- 7,906,799 --

In the Specification

Column 10, Line 3: Please correct "tan 6" to read -- tan δ --

Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*